(12) United States Patent
Koyama et al.

(10) Patent No.: US 6,462,356 B1
(45) Date of Patent: Oct. 8, 2002

(54) LIGHT EMITTING DEVICE

(75) Inventors: Tomoko Koyama, Suwa; Takeo Kaneko, Misato-Mura, both of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/869,157

(22) PCT Filed: Oct. 24, 2000

(86) PCT No.: PCT/JP00/07427

§ 371 (c)(1),
(2), (4) Date: Jun. 25, 2001

(87) PCT Pub. No.: WO01/31979

PCT Pub. Date: Mar. 5, 2001

(30) Foreign Application Priority Data

Oct. 25, 1999 (JP) ............................................ 11/302482
Aug. 11, 2000 (JP) ....................................... 2000/244746

(51) Int. Cl.$^7$ ............................................. H01L 31/12
(52) U.S. Cl. .............................. 257/79; 257/13; 257/82
(58) Field of Search ........................... 257/191, 94–103, 257/185, 201, 614, 200, 43, 59, 82, 79, 410, 613

(56) References Cited

U.S. PATENT DOCUMENTS

| 4,884,112 A | * | 11/1989 | Lorenzo et al. | ............... 257/86 |
| 5,548,137 A | * | 8/1996 | Fan et al. | .................... 257/191 |
| 5,610,413 A | * | 3/1997 | Fan et al. | .................... 257/101 |
| 5,920,086 A | * | 7/1999 | MacFarlane et al. | ........ 257/103 |

FOREIGN PATENT DOCUMENTS

| EP | 0 878 883 A1 | 11/1998 |
| JP | A 63-070257 | 3/1988 |

(List continued on next page.)

OTHER PUBLICATIONS

Dai 7 Kai, Polymer Zairyou Forum Kouen Youshishu, vol. 7 (1998), pp. 375–376 "Yuuki Hakumaku Laser no Jitsugen ni Mukete".
Ouyou Butsuri, vol. 67, No. 9 (1998), pp. 1041–1045 "Photonic Kesshou to sono Ouyou".
U.S. patent application Ser. No. 09/531,330, Koyama et al., filed Mar. 20, 2000.
U.S. patent application Ser. No. 09/920,755, Koyama et al., filed Aug. 3, 2001.
U.S. patent application Ser. No. 09/795,435, Koyama et al., filed Mar. 1, 2001.
U.S. patent application Ser. No. 09/762,614, Koyama et al., filed Feb. 9, 2001.
U.S. patent application Ser. No. 09/878,994, Koyama et al., filed Jun. 13, 2001.

*Primary Examiner*—David Nelms
*Assistant Examiner*—Long K. Tran
(74) *Attorney, Agent, or Firm*—Oliff & Berridge, PLC

(57) ABSTRACT

A light-emitting device (1000) includes a light-emitting device section (100) and a waveguide section (200) which transmits light from the light-emitting device section, and the light-emitting device section and the waveguide section are integrally formed on a substrate (10). The light-emitting device section (100) has a transparent anode (20) which form up a light-propagation section and an optical section (12) formed in part of the anode (20) which are formed on the substrate (10), a first dielectric multilayer film (11*a*), an insulation layer (16) having an opening (16*a*) facing the optical section (12), a light-emitting layer (14), at least part of which is formed in the opening (16*a*) of the insulation layer (16), a cathode (22), and a second dielectric multilayer film (11*b*). The optical section (12) forms a one-dimensional photonic band gap and has a defect section which is set so that the energy level caused by defects is within a specific emission spectrum. The light-emitting device can emit light excelling in wavelength selectivity and having directivity, and can be applied not only to displays but also to optical communications and the like.

23 Claims, 18 Drawing Sheets

FOREIGN PATENT DOCUMENTS

| | | |
|---|---|---|
| JP | A 63-175860 | 7/1988 |
| JP | 1-221741 A | 9/1989 |
| JP | 02-051101 A | 2/1990 |
| JP | A 02-135359 | 5/1990 |
| JP | A 02-135361 | 5/1990 |
| JP | A 03-152184 | 6/1991 |
| JP | 5-29602 A | 2/1993 |
| JP | 5-32523 A | 2/1993 |
| JP | 5-39480 A | 2/1993 |
| JP | A 05-273427 | 10/1993 |
| JP | 5-297202 A | 11/1993 |
| JP | 06-201907 A | 7/1994 |
| JP | 06-224115 A | 8/1994 |
| JP | 06-299148 A | 10/1994 |
| JP | 07-20637 A | 1/1995 |
| JP | 7-181689 A | 7/1995 |
| JP | 07-235075 A | 9/1995 |
| JP | 8-15506 A | 1/1996 |
| JP | 08-248276 A | 9/1996 |
| JP | 9-178901 A | 7/1997 |
| JP | 9-211728 A | 8/1997 |
| JP | 09-311238 A | 12/1997 |
| JP | 10-008300 A | 1/1998 |
| JP | 10-026702 A | 1/1998 |
| JP | A 10-153967 | 6/1998 |
| JP | 2000-035504 A | 2/2000 |
| JP | A 2000-267585 | 9/2000 |

* cited by examiner

A-A

B-B

C-C

A-A

B-B

C-C

LIGHT EMITTING DEVICE

TECHNICAL FIELD

The present invention relates to a light-emitting device using electroluminescence (EL).

BACKGROUND OF ART

Semiconductor lasers have been used as a light source for optical communications systems. Semiconductor lasers excel in wavelength selectivity and can emit light with a single mode. However, it is difficult to fabricate the semiconductor lasers because many stages of crystal growth are required. Moreover, types of light-emitting materials used for semiconductor lasers are limited. Therefore, semiconductor lasers cannot emit light with various wavelengths.

Conventional EL light-emitting devices which emit light with a broad spectral width have been used in some application such as for displays. However, EL light-emitting devices are unsuitable for optical communications and the like, in which light with a narrow spectral width is required.

DISCLOSURE OF INVENTION

An object of the present invention is to provide a light-emitting device which can emit light having a remarkably narrow spectral width in comparison with conventional EL light-emitting devices and exhibiting directivity, and can be applied not only to displays but also to optical communications and the like.

First Light-emitting Device

A first light-emitting device according to the present invention comprises a substrate and a light-emitting device section, wherein the light-emitting device section comprises:
 a light-emitting layer capable of emitting light by electroluminescence;
 a pair of electrode layers for applying an electric field to the light-emitting layer;
 a light-propagation section for propagating light emitted in the light-emitting layer;
 an insulation layer disposed between the pair of electrode layers, having an opening formed in part, and capable of functioning as a current concentrating layer for specifying a region through which current to be supplied to the light-emitting layer flows through the opening; and
 an optical section for light propagated through the light-propagation section,
 wherein the optical section forms photonic band gaps in one dimension or two dimension and has a defect section which is set so that an energy level caused by defects is within a specific emission spectrum, and
 wherein the light emitted in the light-emitting layer is emitted with spontaneous emission in one dimension or two dimension inhibited by the photonic band gap.

According to this light-emitting device, electrons and holes are injected into the light-emitting layer respectively from the pair of electrode layers (cathode and anode). Light is emitted when the molecules return to the ground state from the excited state by allowing the electrons and holes to reconnect in the light-emitting layer. At this time, light with a wavelength in the photonic band gap cannot be propagated through the optical section. Only light with a wavelength equivalent to the energy level caused by the defects is propagated through the optical section. Therefore, light with a very narrow emission spectrum width with spontaneous emission inhibited in one dimension or two dimensions can be obtained with high efficiency by specifying the width of the energy level caused by the defects.

In the present invention, the light-propagation section is part of the light-emitting device section and supplies light obtained in the light-emitting layer in the light-emitting device section to a waveguide section. The light-propagation section includes at least the optical section and a member (one of the electrode layers, for example) which is connected with a core layer in the waveguide section. This is also applicable to a second light-emitting device as described later.

According to the first light-emitting device, since the insulation layer functions as a current concentrating layer in the light-emitting device section, the region through which current supplied to the light-emitting layer flows can be specified. Therefore, current intensity and current distribution can be controlled in the region from which it is desired to emit light, whereby light is emitted with high emission efficiency.

In the case where the insulation layer functions as cladding, assuming that the waveguide formed of a light-emitting layer as a core and an insulation layer as cladding, the guide mode of light propagated toward the waveguide section through the light-propagation section can be controlled by specifying the opening of the insulation layer. Specifically, the guide mode of light propagated through the light-emitting layer (core) can be set at a specified value by specifying the width of the region in which light is confined (width perpendicular to the direction in which light is transmitted) by the insulation layer (cladding) The relation between the guide mode and the waveguide is generally represented by the following equation.

$$\text{Nmax}+1 \geq K_0 \cdot a \cdot (n_1^2 - n_2^2)^{1/2} / (\pi/2)$$

where:
 $K_0$: $2\pi/\lambda$,
 a: half width of waveguide core,
 $n_1$: refractive index of waveguide core,
 $n_2$: refractive index of waveguide cladding, and
 Nmax: maximum value of possible guide mode.

Therefore, if the parameters of the above equation such as the refractive indices of the core and cladding have been specified, the width of the light-emitting layer (core) specified by the width of the opening of the current concentrating layer may be selected depending on the desired guidemode. Specifically, the width (2a) of the light-emitting layer corresponding to the core in a desired guide mode can be calculated from the above equation by substituting the refractive indices of the light-emitting layer provided inside the current concentrating layer and the insulation layer (current concentrating layer) for the refractive indices of the core and cladding of the waveguide, respectively. It is appropriate to determine the suitable width of the core layer of the waveguide section to which light is supplied from the light-emitting device section while taking into consideration the resulting width of the light-emitting layer, calculated value obtained from the above equation based on the desired guide mode, and the like. Light with a desired mode is propagated from the light-emitting device section toward the waveguide section with high combination efficiency by appropriately specifying the width of the light-emitting layer, width of the core layer, and the like. In the light-emitting device section, the light-emitting layer in the current concentrating layer formed using the insulation layer may not uniformly emit light. Therefore, it is appropriate that the designed values for each member such as the light-emitting layer, light-propagation section, and waveguide section be suitably adjusted based on the width (2a) of the core (light-emitting layer) determined using the above equation so that each member exhibits high combination efficiency.

The guide mode of the light-emitting device is preferably 0 to 1000. In particular, when used for communications, the guide mode is preferably about 0 to 10. Light with a specific guide mode can be efficiently obtained by specifying the guide mode of light in the light-emitting layer in this manner.

As described above, according to the present invention, a light-emitting device which can emit light having a remarkably narrow spectral width in comparison with conventional EL light-emitting devices and exhibiting directivity, and can be applied not only to displays but also to optical communications and the like can be provided.

Second Light-emitting Device

A second light-emitting device according to the present invention comprises a light-emitting device section, and a waveguide section which transmits light from the light-emitting device section, the light-emitting device section and the waveguide section being integrally formed on a substrate, wherein the light-emitting device section comprises:
a light-emitting layer capable of emitting light by electroluminescence;
a pair of electrode layers for applying an electric field to the light-emitting layer;
a light-propagation section for propagating light emitted in the light-emitting layer;
an insulation layer which is disposed in contact with the light-propagation section and is capable of functioning as a cladding layer; and
an optical section for light propagated through the light-propagation section,
wherein the waveguide section comprises:
a core layer integrally formed with at least part of the light-propagation section; and
a cladding layer integrally formed with the insulation layer,
wherein the optical section forms photonic band gaps in one dimension or two dimension and has a defect section which is set so that an energy level caused by defects is within a specific emission spectrum, and
wherein the light emitted in the light-emitting layer is emitted with spontaneous emission in one dimension or two dimension inhibited by the photonic band gap.

According to the second light-emitting device, at least part of the light-propagation section in the light-emitting device section is continuously and integrally formed with the core layer in the waveguide section, and the insulation layer (cladding layer) in the light-emitting device section is continuously and integrally formed with the cladding layer in the waveguide section. Therefore, the light-emitting device section and the waveguide section are optically connected with high combination efficiency, thereby enabling efficient light propagation.

In this configuration, as the material for the insulation layer, a material which functions as a cladding layer for the light-propagation section is selected. According to this light-emitting device, since at least part of the light-propagation section in the light-emitting device section and the core layer in the waveguide section can be formed and patterned in the same step, fabrication can be simplified. The insulation layer (cladding layer) in the light-emitting device section and the cladding layer in the waveguide section can be formed and patterned in the same step. This also simplifies the fabrication.

According to the present invention, a light-emitting device which has photonic band gaps in one dimension or two dimensions, can emit light with a remarkably narrow spectral width in comparison with conventional EL light-emitting devices and exhibiting directivity, and can be applied not only to displays but also to optical communications and the like can be provided in the same manner as the first light-emitting device.

The opening formed in the insulation layer which functions as a current concentrating layer and a cladding layer is suitably in the shape of a slit extending in the periodic direction of the optical section, specifically, in the direction in which light is waveguided. At least part of the light-emitting layer is suitably formed in the opening formed in the insulation layer. According to this configuration, the region of the light-emitting layer to which current is supplied and the region specified by the current concentrating layer can be self-alignably positioned.

In the first and second light-emitting devices of the present invention, the optical section has a periodic refractive index distribution in one dimension or two dimensions and forms photonic band gaps in one dimension or two dimensions. The optical section may have a structure such as a grating-shaped structure, a multilayer film structure, a columnar or other columnar-shaped structure, or a combination of these structures. Appropriate examples of the optical section are as follows.

(A) The optical section may have a periodic refractive index distribution in a first direction and include a first medium layer and a second medium layer alternately arranged. In the case of using such an optical section, the light-emitting device according to the present invention suitably has a second photonic band gap capable of inhibiting spontaneous emission of light in two dimensions in combination with a first photonic band gap in one dimension formed by the optical section. Light with a very narrow emission spectrum width with spontaneous emission inhibited in two dimensions can be obtained with high efficiency by the optical section and the second photonic band gap.

(B) The optical section may have a periodic refractive index distribution in first and second directions and include a first medium layer arranged in the shape of a tetragonal lattice and a second medium layer. Since photonic band gaps with spontaneous emission inhibited in two dimensions in two directions can be formed by the optical section, light with a very narrow emission spectrum width can be obtained with high efficiency.

(C) The optical section may have a periodic refractive index distribution in first, second, and third directions in one plane and include a columnar first medium layer arranged in the shape of a triangular lattice or a honey-comb lattice, for example, and a second medium layer. Since photonic band gaps with spontaneous emission inhibited in two dimensions in three directions can be formed by the optical section, light with a very narrow emission spectrum width can be obtained with high efficiency.

The light-emitting layer preferably includes an organic light-emitting material as the light-emitting material. Use of organic light-emitting material widens selection of materials in comparison with the case of using a semiconductor material or inorganic material, for example, thereby enabling light with various wavelengths to be emitted.

These light-emitting device may have various embodiments. Typical embodiments are given below.

(a) In a light-emitting device according to a first embodiment, the light-emitting device section may comprise:

a transparent anode formed on the substrate and capable of functioning as at least part of the light-propagation section;

the optical section formed in part of the anode;

the insulation layer having an opening facing the optical section;

the light-emitting layer, at least part of which is formed in the opening in the insulation layer; and a cathode.

(b) In a light-emitting device according to a second embodiment, the light-emitting device section may comprise:

an intermediate substrate disposed on the substrate, the optical section being formed in part of the intermediate substrate;

a transparent anode which is formed on the optical section in the intermediate substrate and is capable of functioning as at least part of the light-propagation section;

the insulation layer having an opening facing the anode;

the light-emitting layer, at least part of which is formed in the opening in the insulation layer; and a cathode.

Some of the materials which can be used for each section of the light-emitting device according to the present invention are illustrated below. These materials are only part of the conventional materials. Materials other than these materials may also be used.

Light-emitting Layer

The material for the light-emitting layer is selected from conventional compounds in order to obtain light with a predetermined wavelength. Any of organic and inorganic compounds may be used as the materials for the light-emitting layer. It is preferable to use organic compounds from the viewpoint of wide variety of compounds and film-formability.

As examples of such organic compounds, aromatic diamine derivatives (TPD), oxydiazole derivatives (PBD), oxydiazole dimers (OXD-8), distyrylarylene derivatives (DSA), beryllium-benzoquinolinol complex (Bebq), triphenylamine derivatives (MTDATA), rubrene, quinacridone, triazole derivatives, polyphenylene, polyalkylfluorene, polyalkylthiophene, azomethine zinc complex, polyphyrin zinc complex, benzooxazole zinc complex, and phenanthroline europium complex which are disclosed in Japanese Patent Application Laid-open No. 10-153967, and the like can be given.

Moreover, as the materials for the organic light-emitting layer, conventional compounds disclosed in Japanese Patent Application Laid-open No. 63-70257, No. 63-175860, No. 2-135361, No. 2-135359, No. 3-152184, No. 8-248276, No. 10-153967, and the like can be used. These compounds may be used either individually or in combination of two or more.

As examples of inorganic compounds, ZnS:Mn (red region), ZnS:TbOF (green region), SrS:Cu, SrS:Ag, SrS:Ce (blue region), and the like can be given.

Optical waveguide

The optical waveguide includes a layer which functions as a core, and a layer which has a refractive index lower than that of the core and functions as cladding. Specifically, these layers include the light-propagation section (core) and the insulation layer (cladding) in the light-emitting device section, the core layer and the cladding layer in the waveguide section, substrate (cladding), and the like. Conventional inorganic and organic materials may be used for forming the layers which form the optical waveguide.

As typical examples of inorganic materials, $TiO_2$, $TiO_2$—$SiO_2$ mixture, ZnO, $Nb_2O_5$, $Si_3N_4$, $Ta_2O_5$, $HfO_2$, and $ZrO_2$ disclosed in Japanese Patent Application Laid-open No. 5-273427, and the like can be given.

As typical examples of organic materials, conventional resins such as thermoplastic resins, thermosetting resins, and photocurable resins can be given. These resins are appropriately selected depending on the method of forming the layers and the like. For example, use of a resin cured by energy of at least one of heat or light enables utilization of commonly used exposure devices, baking ovens, hot plates, and the like.

As examples of such materials, a UV-curable resin disclosed in Japanese Patent Application No. 10-279439 applied by the applicant of the present invention can be given. As UV-curable resins, acrylic resins are preferable. UV-curable acrylic resins having excellent transparency and capable of curing in a short period of time can be obtained by using commercially-available resins and photosensitizers.

As specific examples of basic components of such UV curable acrylic resins, prepolymers, oligomers, and monomers can be given.

As examples of prepolymers or oligomers, acrylates such as epoxy acrylates, urethane acrylates, polyester acrylates, polyether acrylates, and spiroacetal-type acrylates, methacrylates such as epoxy methacrylates, urethane methacrylates, polyester methacrylates, and polyether methacrylates, and the like can be used.

Examples of monomers include mono functional monomers such as 2-ethylhexyl acrylate, 2-ethylhexyl methacrylate, 2-hydroxyethyl acrylate, 2-hydroxyethyl methacrylate, N-vinyl-2-pyrrolidone, carbitol acrylate, tetrahydrofurfuryl acrylate, isobornyl acrylate, dicyclopentenyl acrylate, and 1,3-butanediol acrylate, bifunctional monomers such as 1,6-hexanediol diacrylate, 1,6-hexanediol dimethacrylate, neopentyl glycol diacrylate, neopentyl glycol dimethacrylate, ethylene glycol diacrylate, polyethylene glycol diacrylate, and pentaerythritol diacrylate, and polyfunctional monomers such as trimethylolpropane triacrylate, trimethylolpropane trimethacrylate, pentaerythritol triacrylate, and dipentaerythritol hexaacrylate.

These inorganic and organic materials are illustrated taking only light confinement into consideration. In the case where the light-emitting device section has a light-emitting layer, hole transport layer, electron transport layer, and electrode layer, and at least one of these layers functions as the core or cladding layer, the materials for these layers may be employed as the material for the layers of the optical waveguide.

Hole Transport Layer

When using an organic light-emitting layer in the light-emitting device section, a hole transport layer may be formed between the electrode layer (anode) and the organic light-emitting layer, as required. As the materials for the hole transport layer, materials conventionally used as hole injection materials for photoconductive materials or materials used for a hole injection layer of organic light-emitting devices can be selectively used. As the materials for the hole transport layer, any of organic and inorganic substances having a function of either hole injection or electron barrier characteristics may be used. As specific examples of such substances, substances disclosed in Japanese Patent Application Laid-open No. 8-248276 can be given.

Electron Transport Layer

In the case of using an organic light-emitting layer in the light-emitting device section, an electron transport layer may be formed between the electrode layer (cathode) and the organic light-emitting layer, as required. Materials for the electron transport layer are only required to have a function of transporting electrons injected from the cathode to the organic light-emitting layer. Such materials can be selected from conventional substances. For example, a substance disclosed in Japanese Patent Application Laid-open No. 8-248276 can be given as specific examples.

Electrode Layer

As the cathode, electron injectable metals, alloys, electrically conductive compounds with a small work function (for example, 4 eV or less), or mixtures thereof can be used. Materials disclosed in Japanese Patent Application Laid-open No. 8-248276 can be given as specific examples of such electrode substances.

As the anode, metals, alloys, electrically conductive compounds with a large work function (for example, 4 eV or more) or mixtures thereof can be used. In the case of using optically transparent materials as the anode, transparent conductive materials such as CuI, ITO, $SnO_2$, and ZnO can be used. In the case where transparency is not necessary, metals such as gold can be used.

The optical section can be formed by conventional methods without specific limitations. Typical examples of such methods are given below.

(1) Lithographic Method

A positive or negative resist is irradiated with ultraviolet rays, X-rays, or the like. The resist layer is patterned by development to form an optical section. As a patterning technology using a resist formed of polymethylmethacrylate or a novolak resin, technologies disclosed in Japanese Patent Applications Laid-open No. 6-224115 and No. 7-20637 can be given.

As a technology of patterning polyimide by photolithography, for example, technologies disclosed in Japanese Patent Applications Laid-open No. 7-181689 and No. 1-221741 can be given. Furthermore, Japanese Patent Application Laid-open No. 10-59743 discloses a technology of forming an optical section of polymethylmethacrylate or titanium oxide on a glass substrate utilizing laser ablation.

(2) Formation of Refractive Index distribution by Irradiation

The optical waveguide section of the optical waveguide is irradiated with light having a wavelength which produces changes in the refractive index to periodically form areas having a different refractive indices on the optical waveguide section, thereby forming an optical section. As such a method, it is preferable to form an optical section by forming a layer of polymers or polymer precursors and polymerizing part of the polymer layer by irradiation or the like to periodically form areas having a different refractive index. Such a technology is disclosed in Japanese Patent Applications Laid-open No. 9-311238, No. 9-178901, No. 8-15506, No. 5-297202, No. 5-32523, No. 5-39480, No. 9-211728, No. 10-26702, No. 10-8300, and No. 2-51101, and the like.

(3) Stamping Method

An optical section is formed by, for example, hot stamping using a thermoplastic resin (Japanese Patent Application Laid-open No. 6-201907), stamping using an UV curable resin (Japanese Patent Application Laid-open No. 10-279439), or stamping using an electron-beam curable resin (Japanese Patent Application Laid-open No. 7-235075).

(4) Etching Method

A thin film is selectively patterned using lithography and etching technologies to form an optical section.

The methods for forming the optical section are described above. In summary, the optical section formed of at least two areas, each having a different refractive index, and can be fabricated, for example, by a method of forming these two areas from two materials having a different refractive index, a method of forming the two areas from one material and modifying the material forming one of the two areas so that the two areas have a different refractive index, and the like.

Each layer of the light-emitting device can be formed by a conventional method. For example, each layer of the light-emitting device is formed using a suitable film-forming method depending on the materials therefor. As specific examples of such a method, a vapor deposition method, spin coating method, LB method, ink jet method, and the like can be can be given.

BEST MODE FOR CARRYING OUT THE INVENTION

First Embodiment

Device

Figure 1:
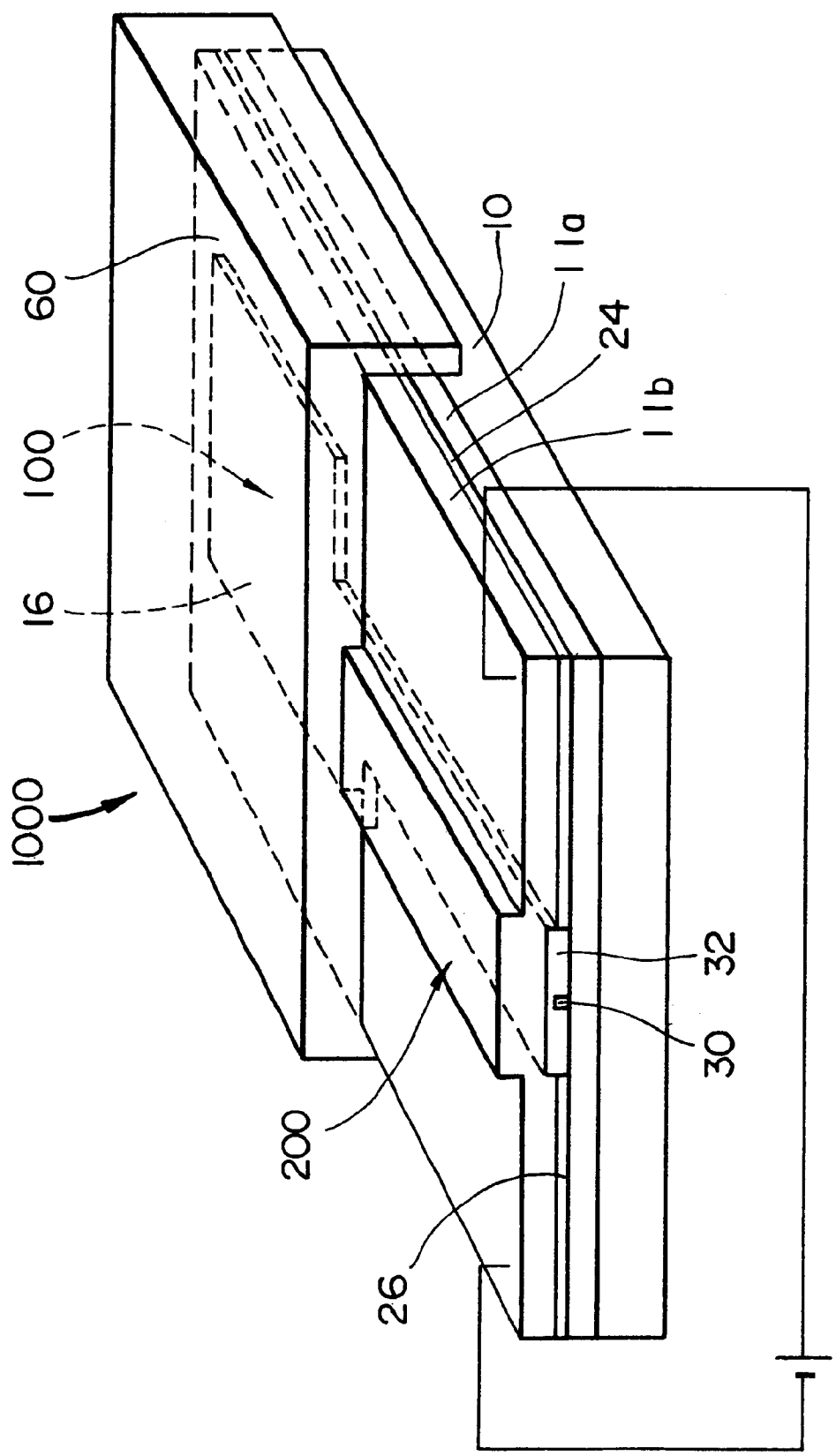
FIG. 1 is an oblique view schematically showing a light-emitting device according to a first embodiment of the present invention.
Figure 2:
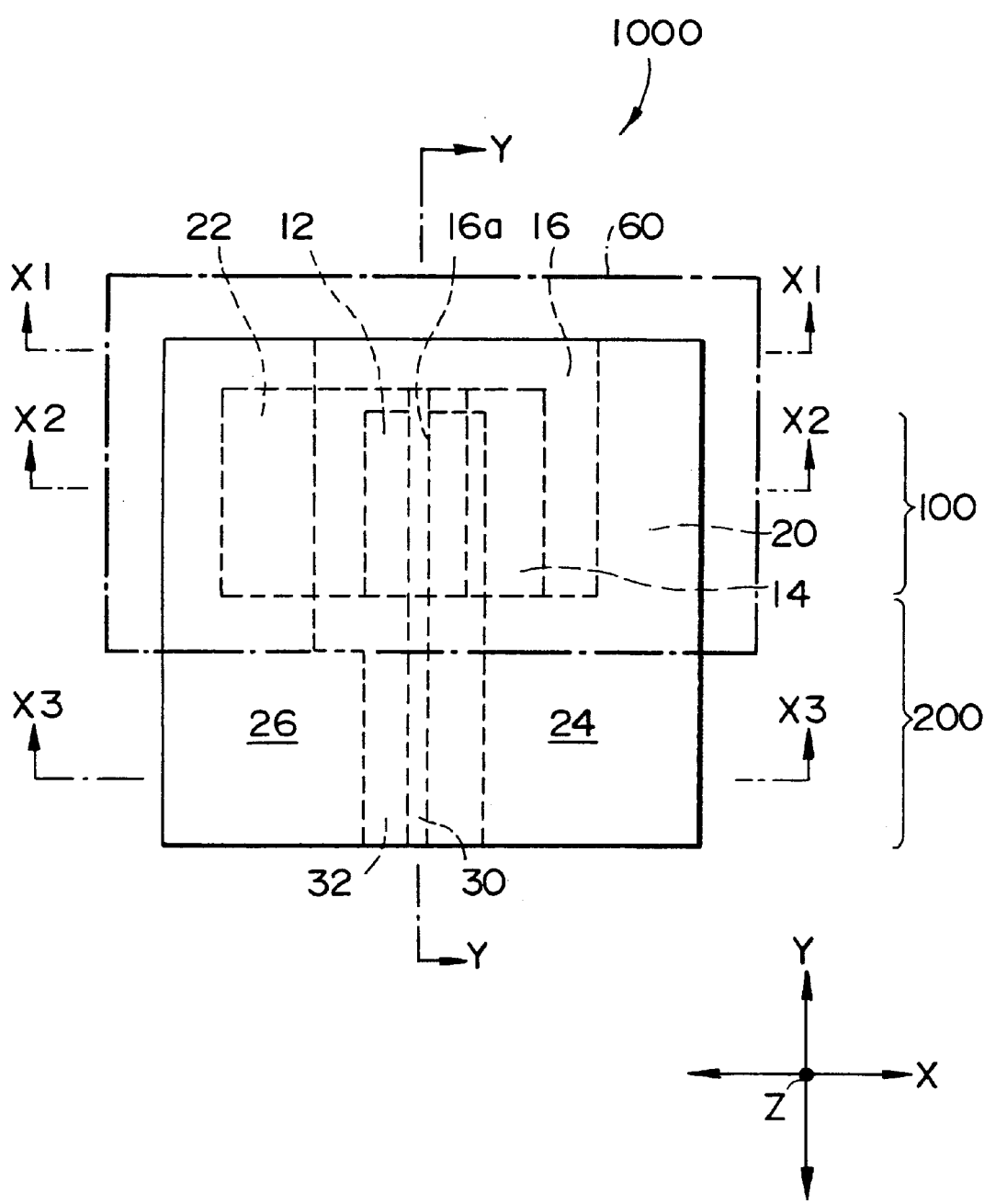
FIG. 2 is a plan view schematically showing the light-emitting device according to the first embodiment of the present invention.
Figure 3:
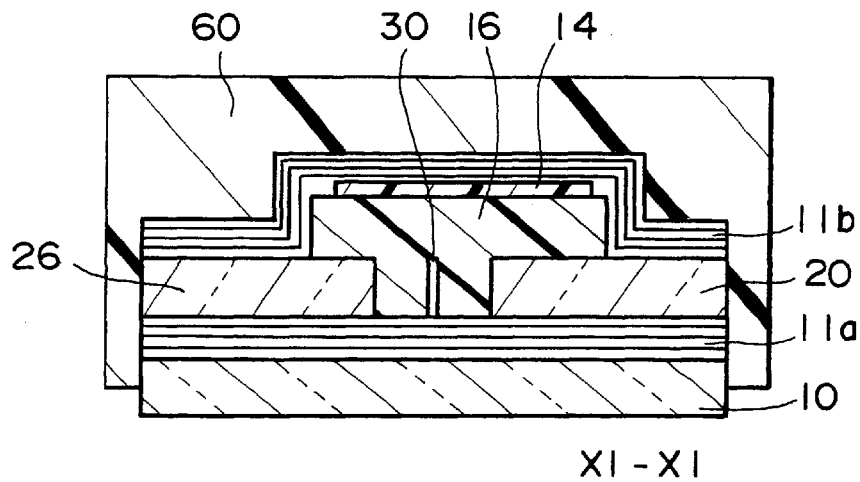
FIG. 3 is a cross-sectional view along the line X1—X1 shown in FIG. 2.
Figure 4:
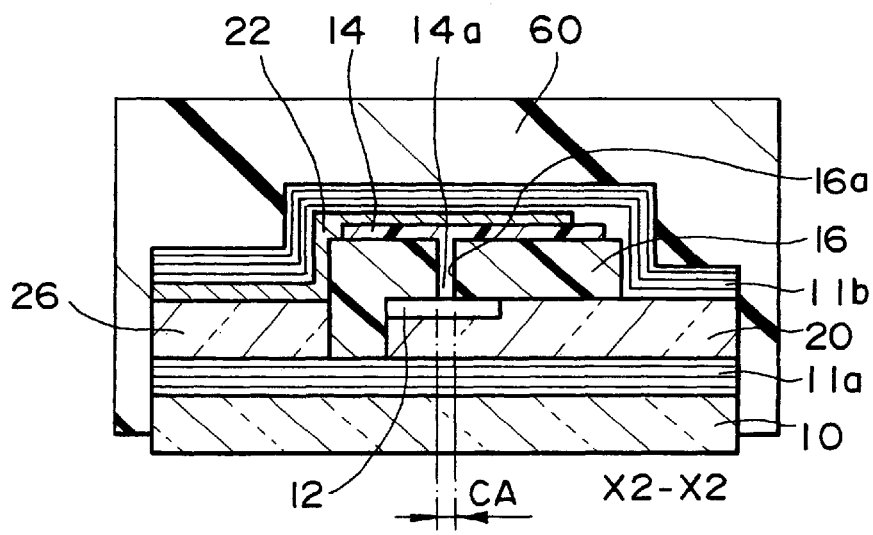
FIG. 4 is a cross-sectional view along the line X2—X2 shown in FIG. 2.
Figure 5:
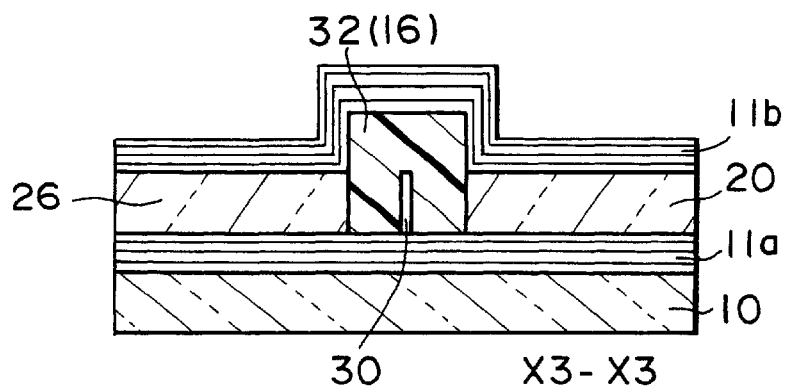
FIG. 5 is a cross-sectional view along the line X3—X3 shown in FIG. 2.
Figure 6:
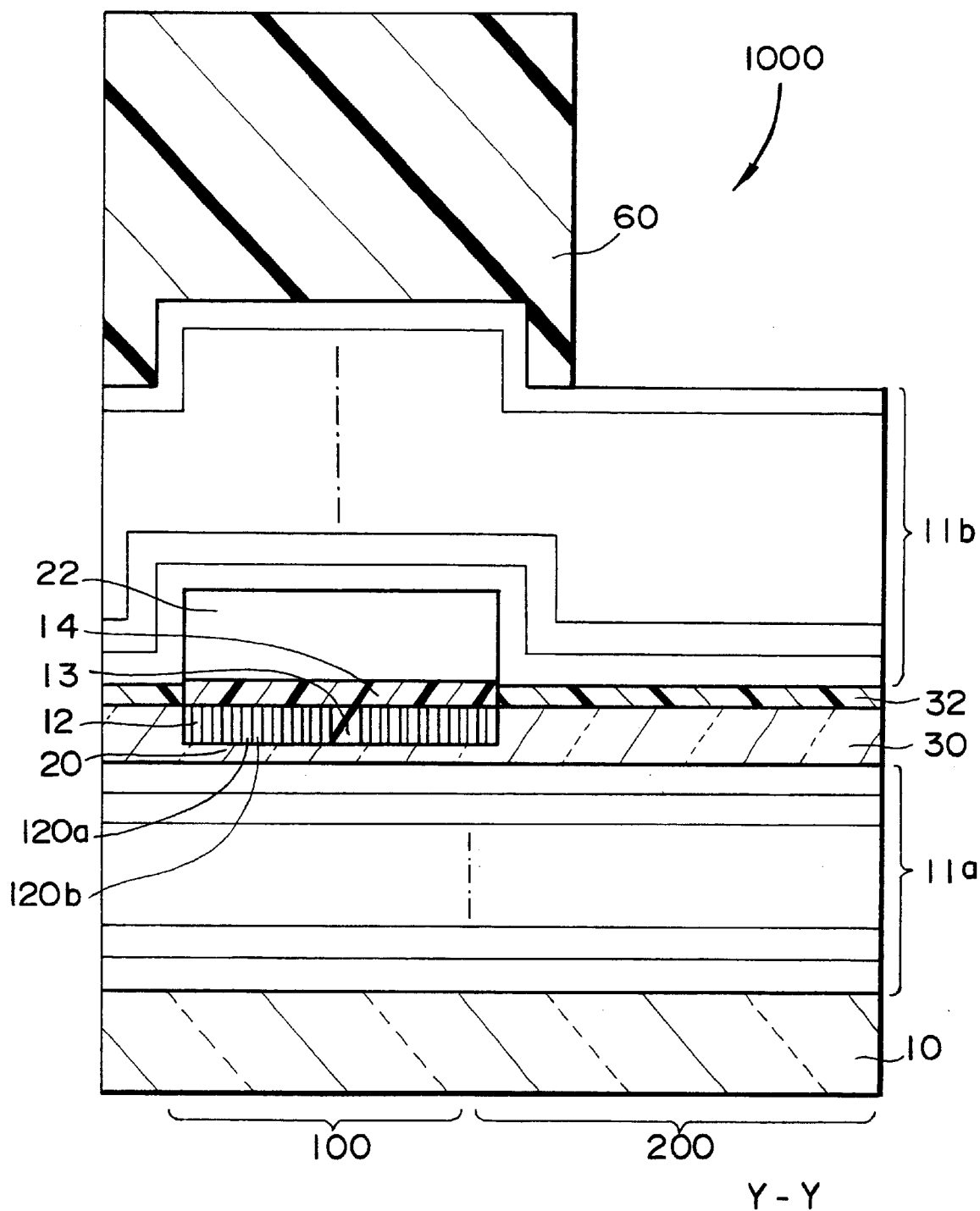
FIG. 6 is a cross-sectional view along the line Y—Y shown in FIG. 2.
Figure 7A:
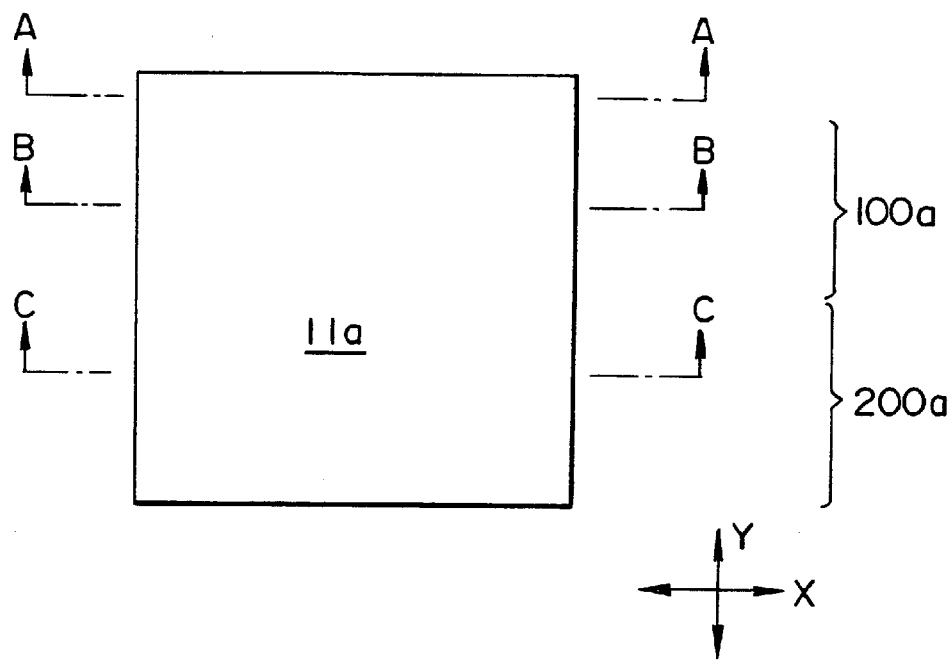
FIG. 7A is a plan view showing a fabrication step of the light-emitting device according to the first embodiment of the present invention.
Figure 7B:
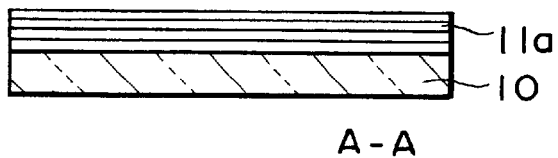
FIGS. 7B to 7D are cross-sectional views along the line A—A, line B—B, and line C—C shown in FIG. 7A, respectively.
Figure 7C:
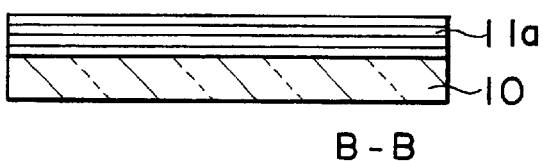
Figure 7D:
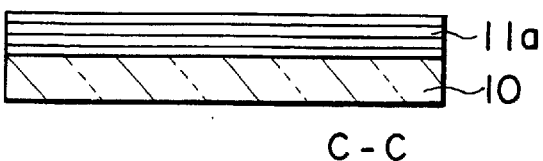
Figure 8A:
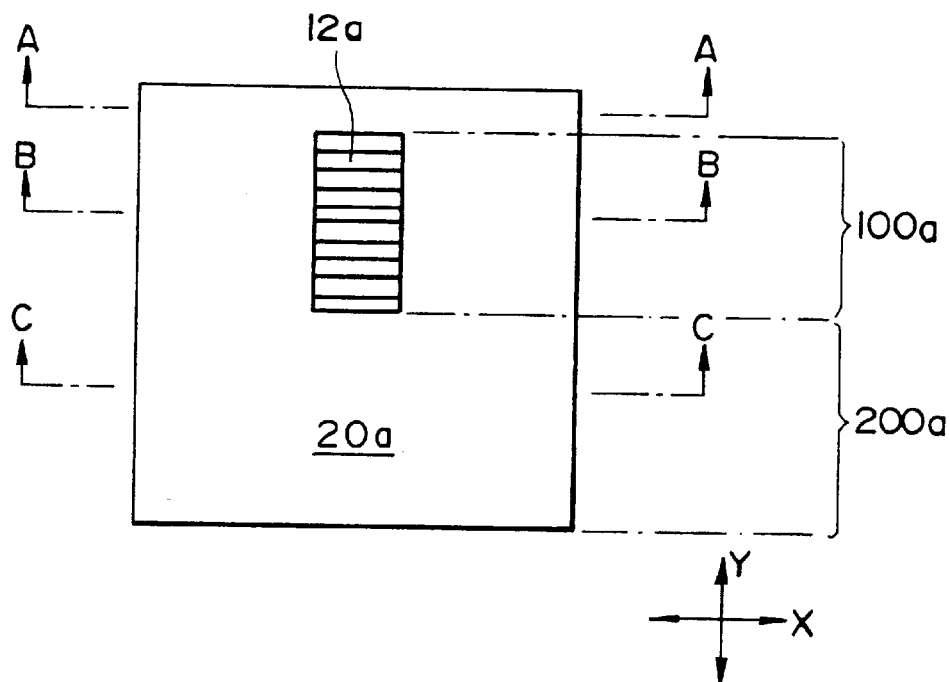
FIG. 8A is a plan view showing a fabrication step of the light-emitting device according to the first embodiment of the present invention.
Figure 8B:
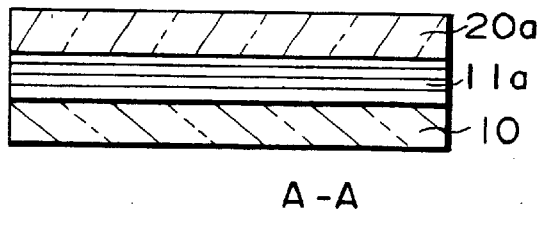
FIGS. 8B to 8D are cross-sectional views along the line A—A, line B—B, and line C—C shown in FIG. 8A, respectively.
Figure 8C:
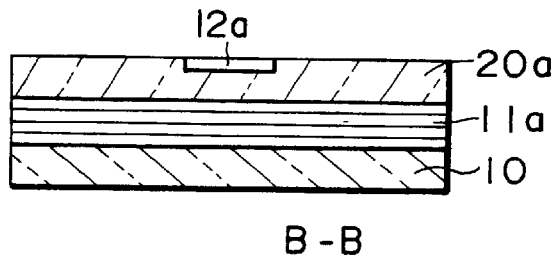
Figure 8D:
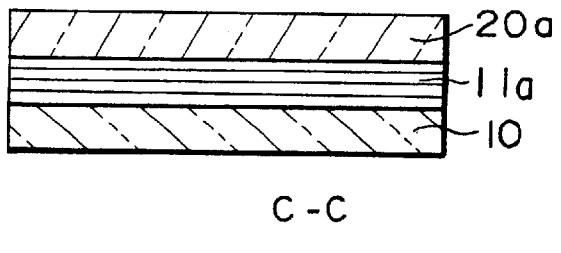
Figure 9A:
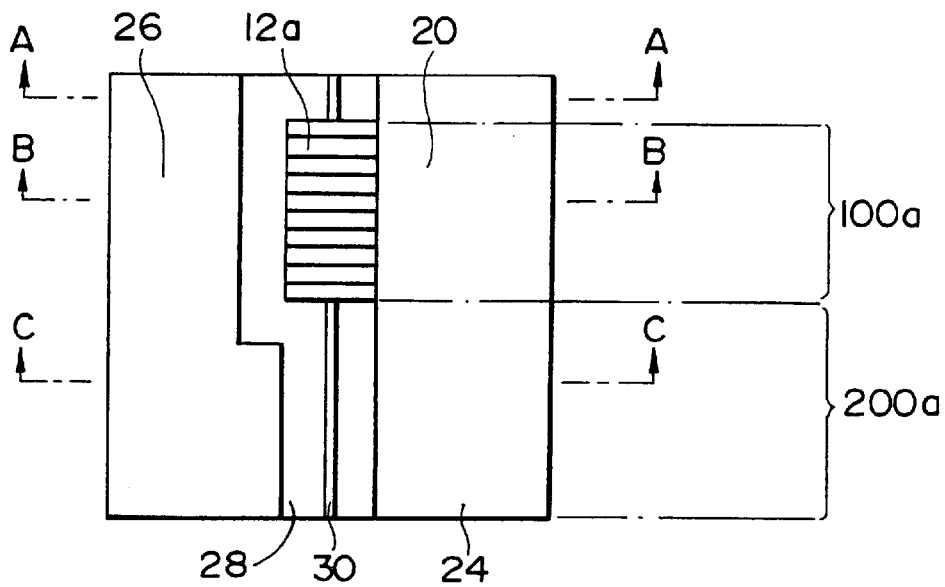
FIG. 9A is a plan view showing a fabrication step of the light-emitting device according to the first embodiment of the present invention.
Figure 9B:
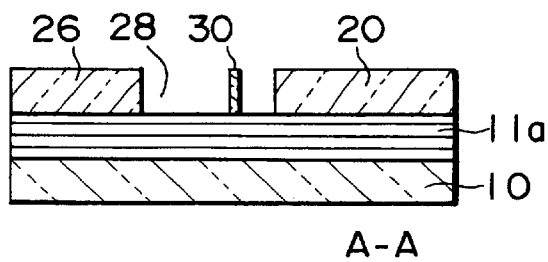
FIGS. 9B to 9D are cross-sectional views along the line A—A, line B—B, and line C—C shown in FIG. 9A, respectively.
Figure 9C:
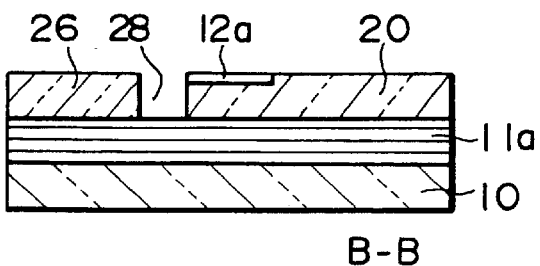
Figure 9D:
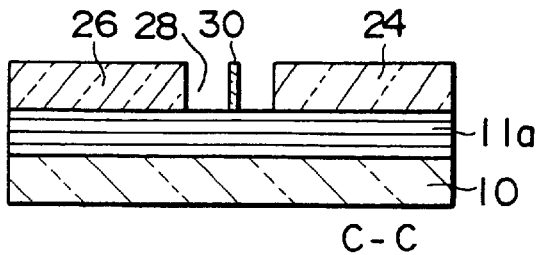
Figure 10A:
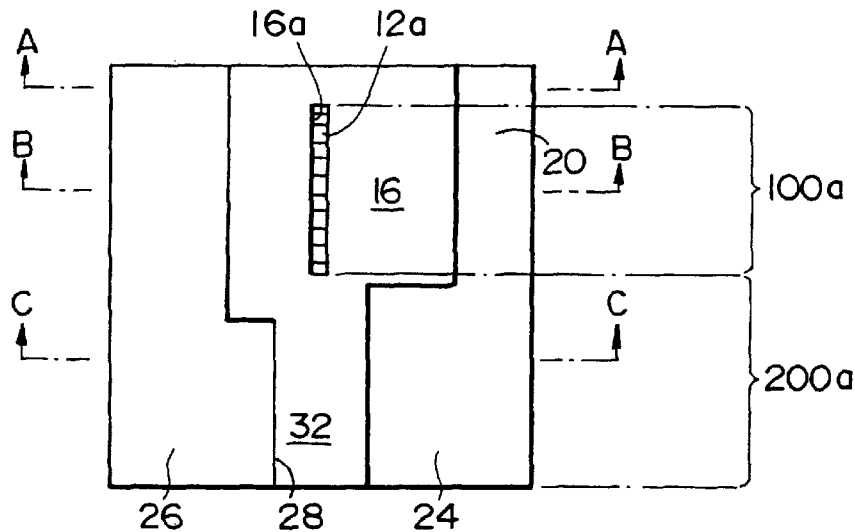
FIG. 10A is a plan view showing the fabrication step of the light-emitting device according to the first embodiment of the present invention.
Figure 10B:
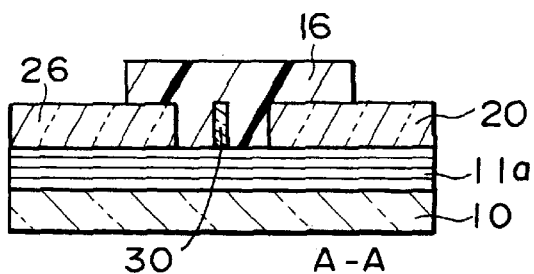
FIGS. 10B to 10D are cross-sectional views along the line A—A, line B—B, and line C—C shown in FIG. 10A, respectively.
Figure 10C:
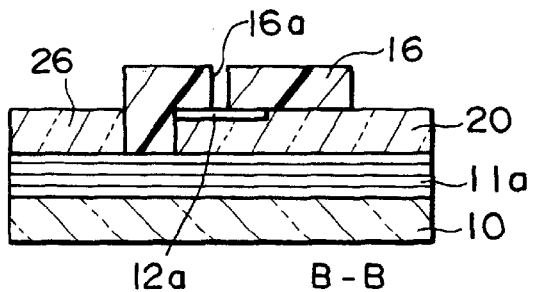
Figure 10D:
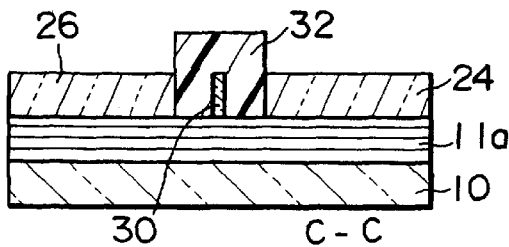

FIG. 1 is an oblique view schematically showing a light-emitting device 1000 according to the present embodiment. FIG. 2 is a plan view schematically showing the light-emitting device 1000. FIG. 3 is a cross-sectional view along the line X1—X1 shown in FIG. 2. FIG. 4 is a cross-sectional view along the line X2—X2 shown in FIG. 2. FIG. 5 is a cross-sectional view along the line X3—X3 shown in FIG. 2. FIG. 6 is a cross-sectional view along the line Y—Y shown in FIG. 2.

The light-emitting device 1000 includes a substrate 10, a light-emitting device section 100, and a waveguide section 200, which are formed on the substrate 10.

In the light-emitting device section 100, a first dielectric multilayer film 11a, an anode 20 and an optical section 12 capable of forming photonic band gaps in one dimension which make up a light-propagation section, a light-emitting layer 14, a cathode 22, and a second dielectric multilayer film 11b are disposed on the substrate 10 in that order. The first and second dielectric multilayer films 11a and 11b form photonic band gaps in one dimension in the direction of the thickness of the optical section 12 (direction perpendicular to the substrate 10, Z direction in FIG. 2). An insulation layer 16 which also functions as a cladding layer and a current concentrating layer is formed to surround the optical section 12 excluding part of the optical section 12. In FIG. 6, the dielectric multilayer films 11a and 11b are illustrated with emphasis.

In the waveguide section 200, the first dielectric multilayer film 11a, the core layer 30, the cladding layer 32 which covers the exposed area of the core layer 30, and the second dielectric multilayer film 11b are disposed on the substrate 10. The first electrode drawing section 24 and the second electrode drawing section 26 are disposed adjacent to the waveguide section 200.

In the present embodiment, a protective layer 60 is formed so as to cover the light-emitting device section 100.

Deterioration of the cathode 22 and the light-emitting layer 14 can be prevented by covering the light-emitting device section 100 with the protective layer 60. In the present embodiment, in order to form the electrode drawing sections 24 and 26, the protective layer 60 is not formed over the entire area of the light-emitting device so as to expose the surface of the waveguide section 200. The protective layer 60 may be formed to cover the entire area of the light-emitting device, as required.

Each component of the light-emitting device section 100 is described below in detail.

The anode 20 in the light-emitting device section 100 is formed using an optically transparent conductive material and forms the light-propagation section. The anode 20 and the core layer 30 in the waveguide section 200 are continuously formed. As the transparent conductive material for forming the anode 20 and the core layer 30, the above-described materials such as ITO can be used. An insulation layer (cladding layer) 16 in the light-emitting device section 100 and the cladding layer 32 in the waveguide section 200 are continuously formed. There are no specific limitations to the material for forming the insulation layer 16 and the cladding layer 32 insofar as the material exhibits insulation and can confine light due to a refractive index lower than that of the anode 20 and that of the core layer 30.

In the light-emitting device section 100, the insulation layer 16 is formed to cover at least the exposed area of the grating-shaped first optical section 12, as shown in FIGS. 2 and 4. The insulation layer 16 has a slit opening 16a extending in the periodic direction of the grating 12, specifically, in the direction in which medium layers having different refractive indices are periodically arranged. The anode 20 and the cathode 22 are disposed in the area in which the opening 16a is formed with the optical section 12 and the light-emitting layer 14 interposed therebetween. The insulation layer 16 is interposed between the anode 20 and the cathode 22 in the area in which the opening 16a is not formed. Therefore, the insulation layer 16 functions as a current concentrating layer. Because of this, when a designed voltage is applied to the anode 20 and the cathode 22, a current mainly flows through a region CA corresponding to the opening 16a. The current can be concentrated along the direction in which light is waveguided by forming the insulation layer (current concentrating layer) 16 in this manner, whereby light emission efficiency can be increased.

The optical section 12 is formed on the upper side of the anode 20 which forms the light-propagation section, in which medium layers having different refractive indices are periodically arranged, as shown in FIGS. 4 and 6. The optical section 12 has a periodic refractive index distribution in the direction in which light is propagated (Y direction in FIG. 2), and forms photonic band gaps in one dimension to a specific spectrum range according to the shape (dimensions) and the medium combination.

For example, the optical section 12 includes a first medium layer 120a and a second medium layer 120b having different refractive indices which are alternately arranged, as shown in FIG. 6. The materials for the first medium layer 120a and second medium layer 120b are not limited insofar as each of these layers can form photonic band gaps by periodic distribution. In the present embodiment, the first medium layer 120a and second medium layer 120b are formed using the material for forming the anode 20 and the light-emitting layer 14, respectively.

The optical section 12 has a defect section 13. The defect section 13 is formed by the light-emitting layer 14. The defect section 13 is formed so that the energy level caused by the defects is within the emission spectrum from the light-emitting layer 14 by electrical pumping.

In the present embodiment, the direction in which light is emitted can be specified by providing a difference in the light confinement conditions between an optical section of the optical section 12 on one side from the defect section 13 and an optical section on the other side. For example, in the case of allowing light to be emitted through the waveguide section 200 as shown in FIG. 1, the light confinement conditions in the optical section on the side of the waveguide section 200 are set weaker than those in the optical section on the other side. Sufficiency of the light confinement conditions can be controlled by the number of pairs of the medium layers in the optical section, difference in the refractive indices of the medium layers in the optical section, and the like, preferably by the number of pairs of the optical sections.

In the light-emitting device 1000 of the present embodiment, since light is confined by the optical section 12 having photonic band gaps in the Y direction shown in FIG. 2 (direction along the core layer 30 in the waveguide section 200), propagation of light in one dimension in the Y direction can be controlled. The first and second dielectric multilayer films 11a and 11b form photonic band gaps to the emission spectrum in the Z direction shown in FIG. 2 (direction perpendicular to the substrate), whereby propagation of light in the Z direction can be controlled. Therefore, in the present embodiment, propagation of light in two dimensions in the Y and z directions can be controlled by the optical section 12 and the first and second dielectric multilayer films 11a and 11b.

Light with a leaky mode can be propagated in other directions. In order to control propagation of light with a leaky mode, a cladding layer or a dielectric multilayer mirror may be optionally formed in order to confine light.

The first electrode drawing section 24 and the second electrode drawing section 26 adjacent to the waveguide section 200 are electrically isolated by the insulating cladding layer 32 continuously formed with the insulation layer 16, as shown in FIG. 2. The first electrode drawing section 24 is continuous with the anode 20 in the light-emitting device section 100 and functions as a unloading terminal for the anode 20. The second electrode drawing section 26 is formed so as to extend toward the light-emitting device section 100. Part of the second electrode drawing section 26 is electrically connected to the cathode 22. Therefore, the second electrode drawing section 26 functions as an drawing electrode for the cathode 22. In the present embodiment, the first and second electrode drawing sections 24 and 26 are formed in the same forming step as the anode 20.

The above-described methods and materials may be appropriately used as the method of fabricating the optical section 12 of the light-emitting device 1000 and the materials for forming each layer. These methods, materials, and structures are also applicable to other embodiments described later.

Either the first medium layer 120a or the second medium layer 120b which forms the optical section 12 may be a gaseous layer such as air. In the case of forming the optical section using a gaseous layer, the difference in the refractive index between two medium layers which form the optical section can be increased using the material generally used for light-emitting devices, whereby an optical section exhibiting high efficiency for a desired wavelength of light can be obtained. This modification example is also applicable to other embodiments.

At least either a hole transport layer or an electron transport layer may be formed in the light-emitting device section, as required. This modification example is also applicable to other embodiments.

Device Operation

The operation and the action of the light-emitting device 1000 are described below.

Electrons and holes are injected into the light-emitting layer 14 respectively from the cathode 22 and the anode 20 by applying a specific voltage to the anode 20 and the cathode 22. The electrons and holes are reconnected in the light-emitting layer 14, whereby excitons are formed. Light such as fluorescent light or phosphorescent light is emitted when the excitons deactivate. Since the region CA (see FIG. 4) through which current flows is specified by the insulation layer 16 interposed between the anode 20 and the cathode 22 as described above, current can be efficiently supplied to the region from which light should be emitted.

Light emitted in the light-emitting layer 14 is introduced into the light-propagation section including the anode 20 and the optical section 12. Light with an energy level caused by the defects in the defect section 13 is propagated in the optical section 12. Specifically, light with a spectrum range equivalent to the photonic band gaps of the optical section 12 cannot be propagated in the optical section 12. The excitons produced in the defect section 13 are returned to the ground state at an energy level caused by the defects, whereby only light with a spectrum range corresponding to this energy level is emitted. Light introduced into the light-propagation section is propagated through the light-propagation section toward the edge thereof (toward the waveguide section 200). The light is propagated through the core layer 30 in the waveguide section 200 continuously formed with part of the light-propagation section (anode 20) and emitted from the edge thereof. Since only light with a specific spectrum range is emitted by the photonic band gaps in two dimensions formed by the optical section 12 in the light-propagation section and the first and second dielectric multilayer films 11a and 11b, the emitted light has wavelength selectivity, a narrow emission spectrum width, and excellent directivity.

Effect

Major effects of the present embodiment are given below.

(a) According to the light-emitting device 1000 of the present embodiment, the anode 20 and the cathode 22 are electrically connected through the light-emitting section 14a with which the opening 16a in the insulation layer 16 is filled. The region through which current flows is specified by the opening 16a. Therefore, since the insulation layer 16 functions as a current concentrating layer, current is efficiently supplied to the light-emitting region, thereby increasing light emission efficiency. The light-emitting region can be set while being aligned with the core layer 30 by specifying the region to which current is supplied using the current concentrating layer (insulation layer 16). This also increases light combination efficiency with the waveguide section 200.

(b) According to the light-emitting device 1000, electrons and holes are injected into the light-emitting layer 14 respectively from the cathode 22 and the anode 20. Light is emitted when the molecules return to the ground state from the excited state by allowing the electrons and holes to reconnect in the light-emitting layer. At this time, light with a wavelength in the photonic band gaps formed by the optical section 12 and the first and second dielectric multilayer films 11a and 11b cannot be propagated through the optical section. Only light with a wavelength equivalent to the energy level caused by the defect section 13 is propagated through the optical section. Therefore, light with a very narrow spectrum width with spontaneous emission inhibited in two dimensions (X direction-Z direction) can be obtained with high efficiency by specifying the width of the energy level caused by the defect section 13.

(c) At least part (anode 20) of the light-propagation section in the light-emitting device section 100 is continuously and integrally formed with the core layer 30 in the waveguide section 200. This enables the light-emitting device section 100 and the waveguide section 200 to be optically connected with high combination efficiency, thereby ensuring efficient propagation of light. The light-propagation section including the anode 20 and the core layer 30 can be formed and patterned in the same step, whereby fabrication can be simplified.

The insulation layer (cladding layer) 16 in the light-emitting device section 100 is continuously and integrally formed with the cladding layer 32 in the waveguide section 200. This enables the light-emitting device section 100 (light-propagation section, in particular) and the waveguide section 200 to be optically connected with high combination efficiency, thereby ensuring efficient propagation of light. The insulation layer 16 and the cladding layer 32 can be formed and patterned in the same step, whereby fabrication can be simplified.

As described above, according to the light-emitting device 1000 of the present embodiment, the light-emitting device section 100 and the waveguide section 200 can be connected with high combination efficiency, whereby light can be emitted with high efficiency.

(d) In the present embodiment, the optical section 12 can be formed using either an organic material or inorganic material. Therefore, the light-emitting device 1000 is less affected by the irregular state or impurities at the boundary of the medium layer in the optical section than in the case of using a semiconductor as the material for the optical section, whereby excellent photonic band gap characteristics can be obtained.

These effects are the same as in other embodiments.

Fabrication Process

A fabrication example of the light-emitting device 1000 according to the present embodiment is described below with reference to FIGS. 7 to 14. In FIGS. 7 to 14, (A) shows a plan view and (B) to (D) show cross-sectional views along any of the line A—A, line B—B, and line C—C shown in (A). Symbols 100a and 200a in FIGS. 7 to 11 respectively show regions in which the light-emitting device section 100 and the waveguide section 200 are formed.

(1) Formation of First Dielectric Multilayer Film

The dielectric multilayer film 11a which forms photonic band gaps are formed, as shown in FIGS. 7A to 7D. The dielectric multilayer film 11a is formed so as to function as photonic band gaps to light with a specific wavelength, specifically, light within the emission spectrum. Specifically, the dielectric multilayer film 11a has a periodic refractive index distribution in the direction of the thickness of the substrate 10 in which two medium layers having different refractive indices are alternately formed.

(2) Formation of Conductive Layer and Optical Section

The conductive layer 20a is formed on the first dielectric multilayer film 11a formed on the substrate 10 using an optically transparent conductive material, as shown in FIGS. 8A to 8D. The method of forming the conductive layer 20a is appropriately selected according to the material for the conductive layer 20a and the like. The above-described method can be used. In the case of forming the conductive layer 20a using ITO, for example, a forming process is preferably used.

A projected and depressed portion 12a for forming one of the medium layers in the optical section which forms the photonic band gap is formed on the surface of the conductive layer 20a, in the region 100a in which the light-emitting device section 100 is formed. The method of forming the projected and depressed portion 12a is appropriately selected according to the material for the conductive layer 20a and the like. The above-described method such as lithography and stamping can be used. In the case where the conductive layer 20a is formed using ITO, for example, the projected and depressed portion 12a may be formed using lithography and etching, or a liquid phase process such as an ink jet process using liquid ITO. The projected and depressed portion 12a for the optical section is formed so that the concavities and convexities with a predetermined pitch are continuously formed in the Y direction in FIGS. 8A to 8D.

The anode 20, the first and second electrode drawing sections 24 and 26, and the core layer 30 are formed by patterning the conductive layer 20a by lithography, for example, as shown in FIGS. 9A to 9D.

The anode 20 and the first electrode drawing section 24 are continuously formed. The second electrode drawing section 26 is isolated from the anode 20 and the first electrode drawing section 24 by an opening 28. The projected and depressed portion 12a for the optical section is integrally formed with the anode 20. Part of the anode 20 including the projected and depressed portion 12a also functions as a light-propagation section. The core layer 30 is continuously and integrally formed with the anode 20 (projected and depressed portion 12a) The core layer 30 is isolated from the first and second electrode drawing sections 24 and 26 by the opening 28.

As described above, the light-propagation section including the optical section and the optical section such as the core layer can be simultaneously formed with the electrodes (anode and electrode drawing sections in this example) by selecting the material for the conductive layer 20a while taking into consideration the optical characteristics such as the refractive index.

(3) Formation of Insulation Layer

The insulation layer 16 with a specific pattern is formed so that the opening 28 is filled therewith, as shown in FIGS. 10A to 10D. The insulation layer 16 has the opening 16a which exposes part of the projected and depressed portion 12a for the optical section. The opening 16a is formed in the shape of a slit extending along the direction in which light is waveguided. Since the region through which current flows is specified by the opening 16a, the length and the width of the opening 16a are set while taking into consideration a desired current density, current distribution, and the like. Since the insulation layer 16 functions not only as the current concentrating layer but also as the cladding layer to confine light, the material therefor is selected while taking into consideration insulation and the optical characteristics such as the refractive index. The material for forming the insulation layer 16 with which the concavity of the projected and depressed portion 12a for the optical section is filled makes up the optical section 12. Therefore, as the material for forming the insulation layer 16, a material exhibiting insulation functions as well as optical functions for forming one of the medium layers in the optical section 12 which forms the photonic band gaps is selected.

In the case of using ITO as the conductive layer, polyimide, polyamide, polyethyleneterephthalate, polyether sulfone, silicon polymer, or the like can be used as the material for the insulation layer 16.

The insulation layer 16 electrically isolates the anode 20 and the first electrode drawing section 24 from the second electrode drawing section 26. Moreover, the insulation layer 16 functions as a cladding layer which covers part of the projected and depressed portion 12*a* for the optical section. The insulation layer 16 forms the cladding layer 32 which covers the exposed area of the core layer 30.

(4) Formation of Light-emitting Layer

Figure 11A:
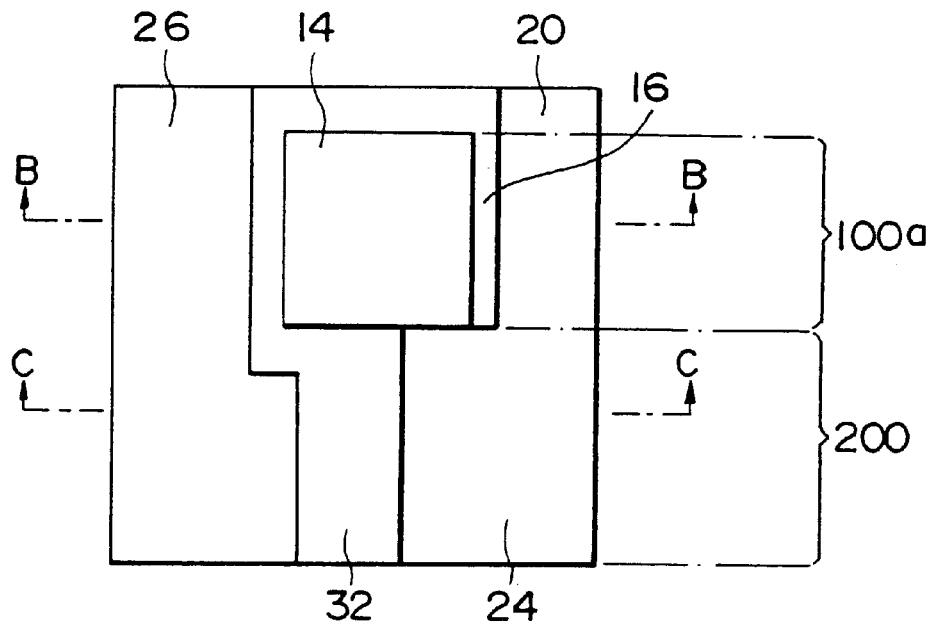
FIG. 11A is a plan view showing the fabrication step of the light-emitting device according to the first embodiment of the present invention.
Figure 11B:
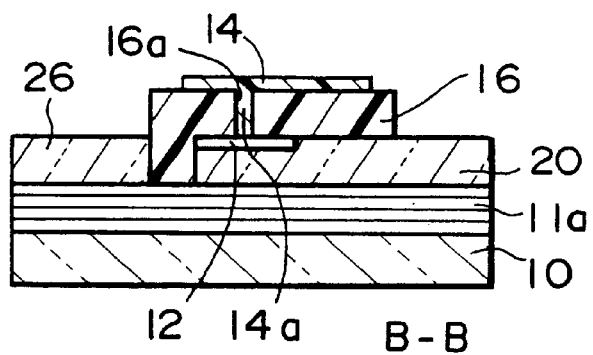
FIGS. 11B and 11C are cross-sectional views along the line B—B and the line C—C shown in FIG. 11A, respectively.
Figure 11C:
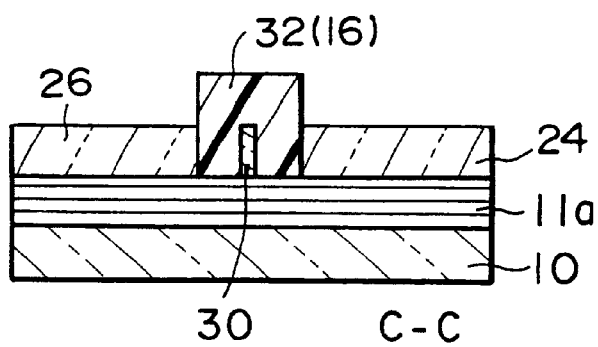

The light-emitting layer 14 is formed in a designed region of the region 100*a* in which the light-emitting device section 100 is formed, as shown in FIGS. 11A to 11C. The light-emitting layer 14 has the light-emitting section 14*a* in which at least the opening 16*a* formed in the insulation layer 16 is filled with a light-emitting material. The material for forming the light-emitting layer 14 with which the concavity of the projected and depressed portion 12*a* for the optical section is filled makes up the optical section 12. Therefore, as the material for forming the light-emitting layer 14i a material exhibiting light-emitting functions as well as optical functions for forming one of the medium layers in the optical section 12 which forms the photonic band gaps is selected.

(5) Formation of Cathode

Figure 12A:
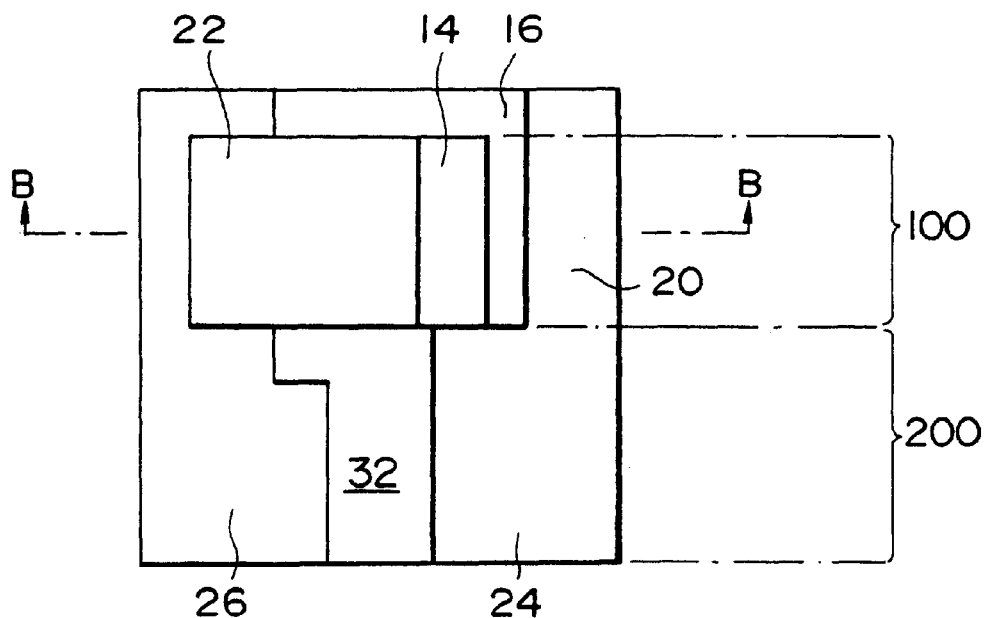
FIG. 12A is a plan view showing the fabrication step of the light-emitting device according to the first embodiment of the present invention.
Figure 12B:
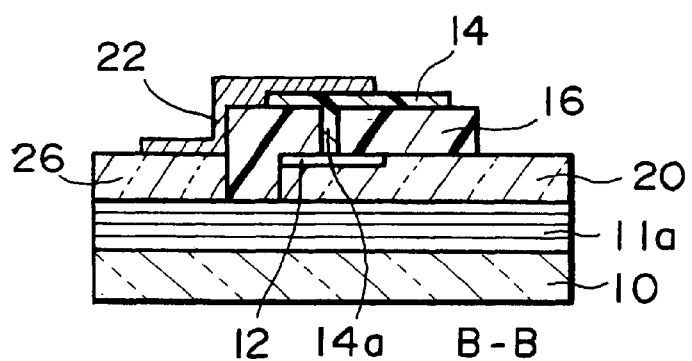
FIG. 12B is a cross-sectional view along the line B—B shown in FIG. 12A.

The cathode 22 is formed in the region 100*a* in which the light-emitting device section 100 is formed, as shown in FIGS. 12A and 12B. The cathode 22 is formed to cover the light-emitting section 14*a* of the light-emitting layer 14 with one end superposed on the second electrode drawing section 26. The light-emitting device section 100 and the waveguide section 200 are thus formed.

(6) Formation of Second Dielectric Multilayer Film

Figure 13A:
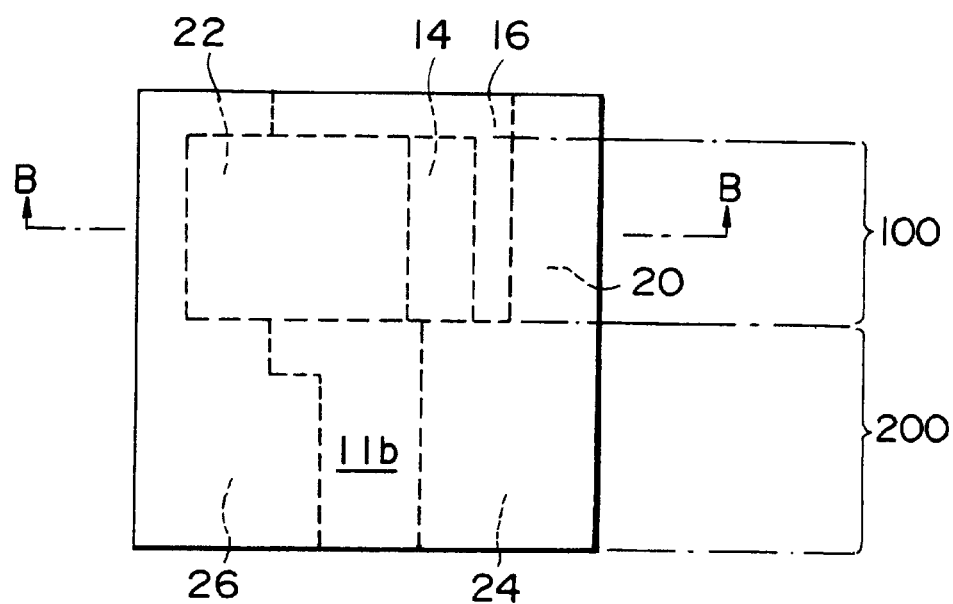
FIG. 13A is a plan view showing the fabrication step of the light-emitting device according to the first embodiment of the present invention.
Figure 13B:
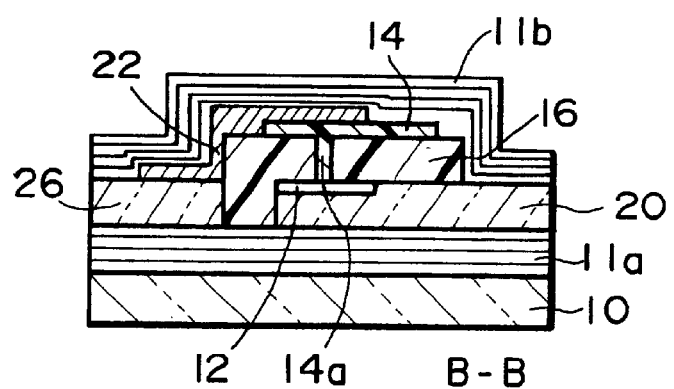
FIG. 13B is a cross-sectional view along the line B—B shown in FIG. 13A.

The dielectric multilayer film 11*b* which forms photonic band gaps is formed, as shown in FIGS. 13A and 13B. The dielectric multilayer film 11*b* is formed so as to function as the photonic band gap to light with a specific wavelength, specifically, light within the emission spectrum in the same manner as the dielectric multilayer film 11*a*. Specifically, the dielectric multilayer film 11*b* has a periodic refractive index distribution in the direction of the thickness of the substrate 10 in which two medium layers having different refractive indices are alternately formed.

(7) Formation of Protective Layer

Figure 14A:
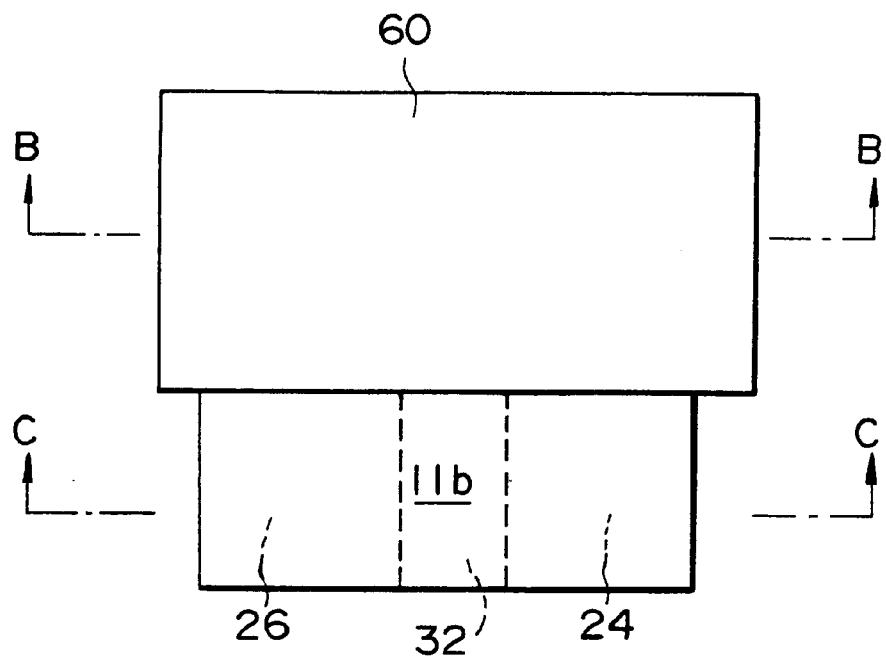
FIG. 14A is a plan view showing the fabrication step of the light-emitting device according to the first embodiment of the present invention.
Figure 14B:
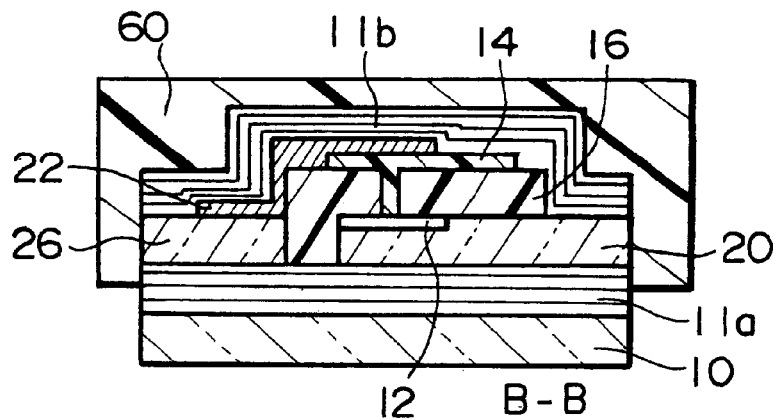
FIGS. 14B and 14C are cross-sectional views along the line B—B and the line C—C shown in FIG. 14A, respectively.
Figure 14C:
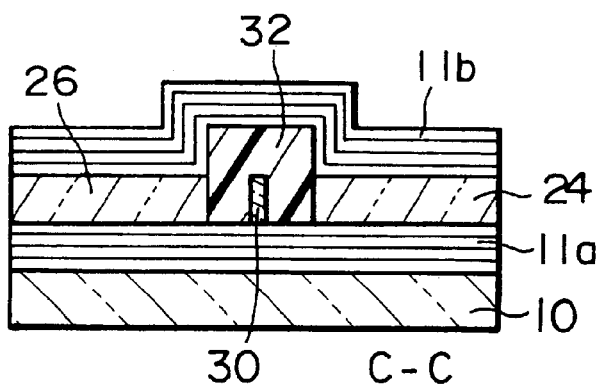

The protective layer 60 is formed so as to cover at least the light-emitting device section 100, as shown in FIGS. 14A to 14C. It is preferable that the protective layer 60 be formed so that the cathode 22, the light-emitting layer 14, and the anode 20 do not come in contact with the outside. In particular, since the cathode 22 which is generally formed of an active metal and the light-emitting layer 14 which is formed of an organic material tend to be degraded by atmosphere or water, the protective layer 60 is formed so as to prevent such a degradation. The protective layer 60 is preferably formed using a resin material such as an epoxy resin, silicone resin, or UV-curable resin.

The light-emitting device 1000 is formed by these steps. According to this fabrication method, the light-propagation section (part of anode 20) including the projected and depressed portion 12*a* for the optical section and the core layer 30 can be simultaneously formed with the electrode sections (anode 20 and electrode drawing sections 24 and 26 in this example) by selecting the material for the conductive layer 20*a* while taking into consideration the optical characteristics such as the refractive index, thereby simplifying the fabrication.

Second Embodiment

Figure 15:
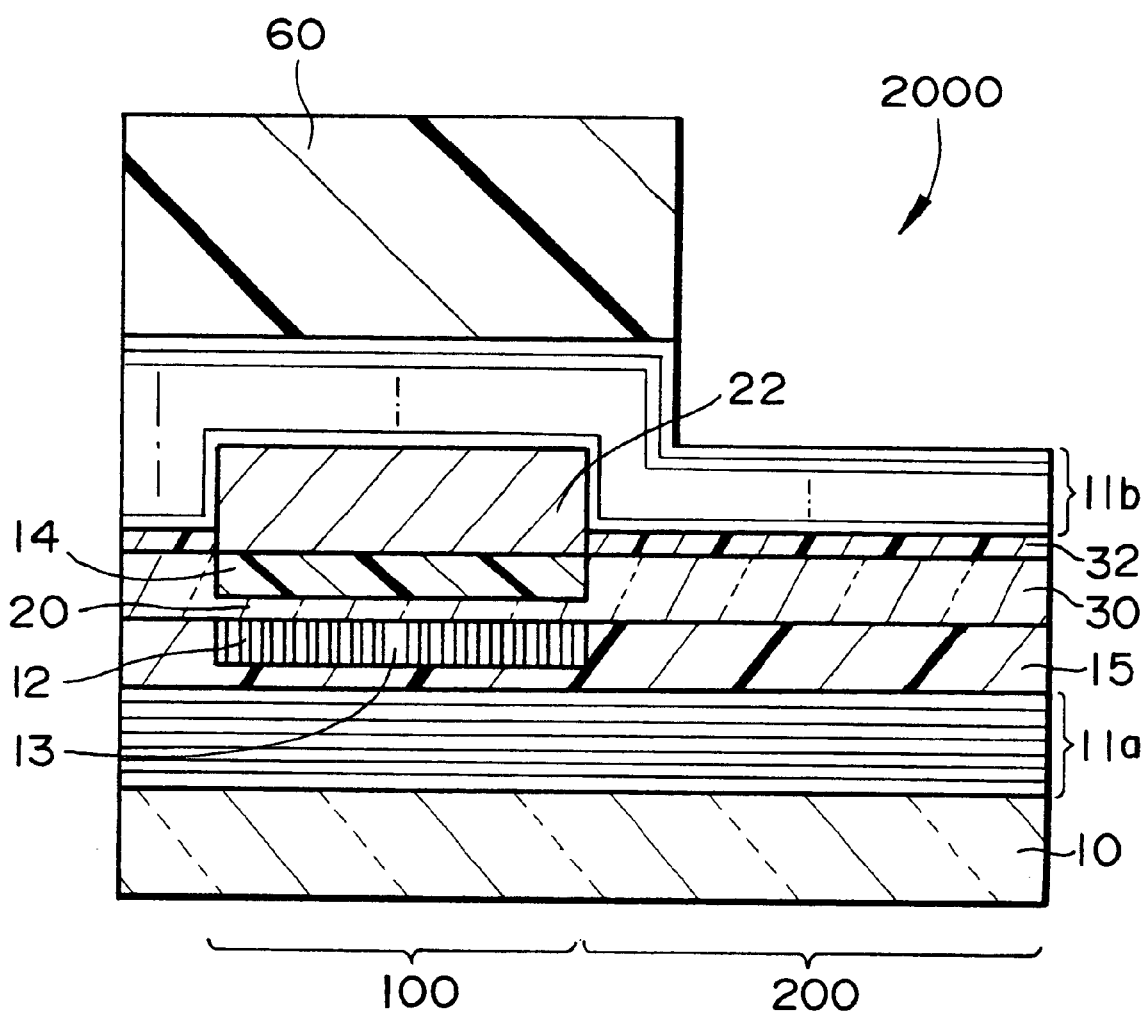
FIG. 15 is a cross-sectional view schematically showing a light-emitting device according to a second embodiment of the present invention.

FIG. 15 is a cross-sectional view schematically showing a light-emitting device 2000 according to the present embodiment. FIG. 15 shows a section corresponding to FIG. 6 used to illustrate the first embodiment.

The light-emitting device 2000 differs from the light-emitting device 1000 according to the first embodiment as to the area in which the optical section is formed. Sections having substantially the same functions as those of the light-emitting device 1000 are indicated by the same symbols.

In the following description, only major features of the light-emitting device 2000 differing from the light-emitting device 1000 are described.

The light-emitting device 2000 includes the substrate 10, the light-emitting device section 100, and the waveguide section 200 which are formed on the substrate 10.

In the light-emitting device section 100, the first dielectric multilayer film 11*a*, a second substrate 15, the anode 20 and the optical section 12 which make up a light-propagation section, the light-emitting layer 14, the cathode 22, and the second dielectric multilayer film 11*b* are disposed on the first substrate 10 in that order. The present embodiment differs from the first embodiment in that the second substrate (intermediate substrate) 15 for forming the optical section 12 is disposed on the first dielectric multilayer film 11*a*.

As the material for the second substrate 15, a material enabling the optical section 12 to be easily formed in comparison with the first substrate 10 or a material with a refractive index higher than that of the first substrate 10 is preferably selected. The second substrate 15 may be formed using a resin to which lithography, formation of a refractive index distribution by irradiation, stamping, and the like can be applied such as a resin which is cured upon irradiation of ultraviolet rays or electron beams. In the example shown in FIG. 15, a first medium layer in the optical section 12 which forms photonic band gaps is formed using the material for forming the second substrate 15, and the second medium layer is formed using the material for forming the anode 20.

In the present embodiment, since the material advantageous for forming the optical section 12 can be selected as the material for the second substrate 15, formation of the optical section 12 becomes easy. For example, a flexible substrate material may be used differing from the first substrate 10. In particular, in the case of forming the projected and depressed portion by applying the material for the second substrate 15 onto the first substrate 10 using a rigid mold, curing the material by heating, and removing the mold, removal of the mold becomes easy and accuracy of the optical section can be improved. In the case of forming not only the light-emitting device section but also other members or devices on the second substrate 15, an optimum material for the substrate can be selected, whereby optimum characteristics can be obtained in the resulting light-emitting device.

Other structures and effects of the light-emitting device 2000 according to the present embodiment are the same as those of the light-emitting device 1000 according to the first embodiment. Therefore, further description is omitted.

Third Embodiment

Figure 16:
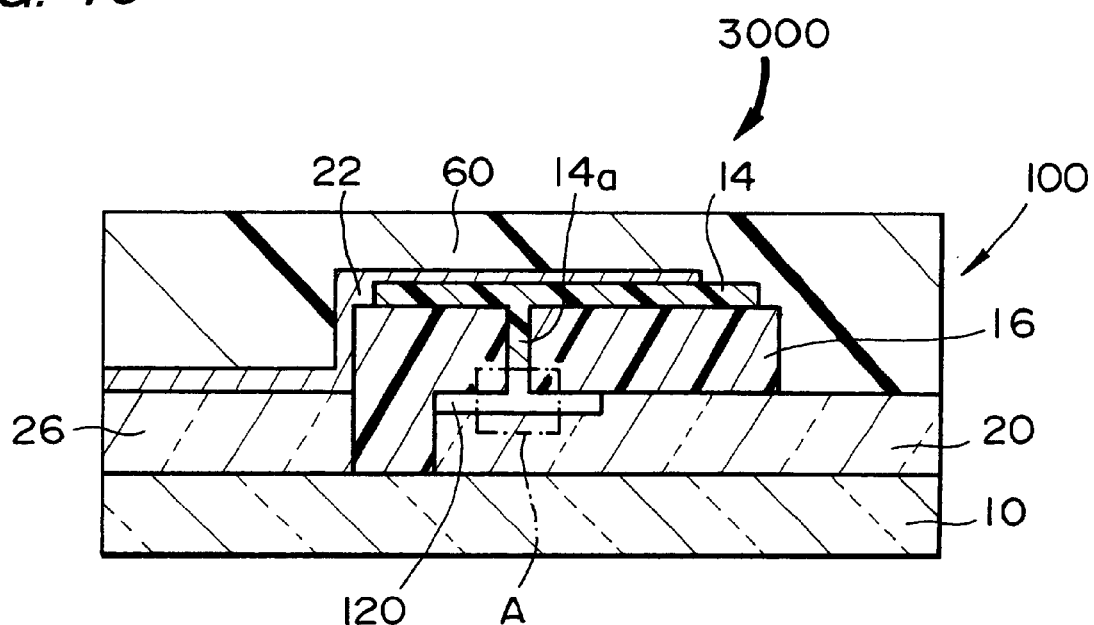
FIG. 16 is a cross-sectional view schematically showing a light-emitting device according to a third embodiment of the present invention.
Figure 17:
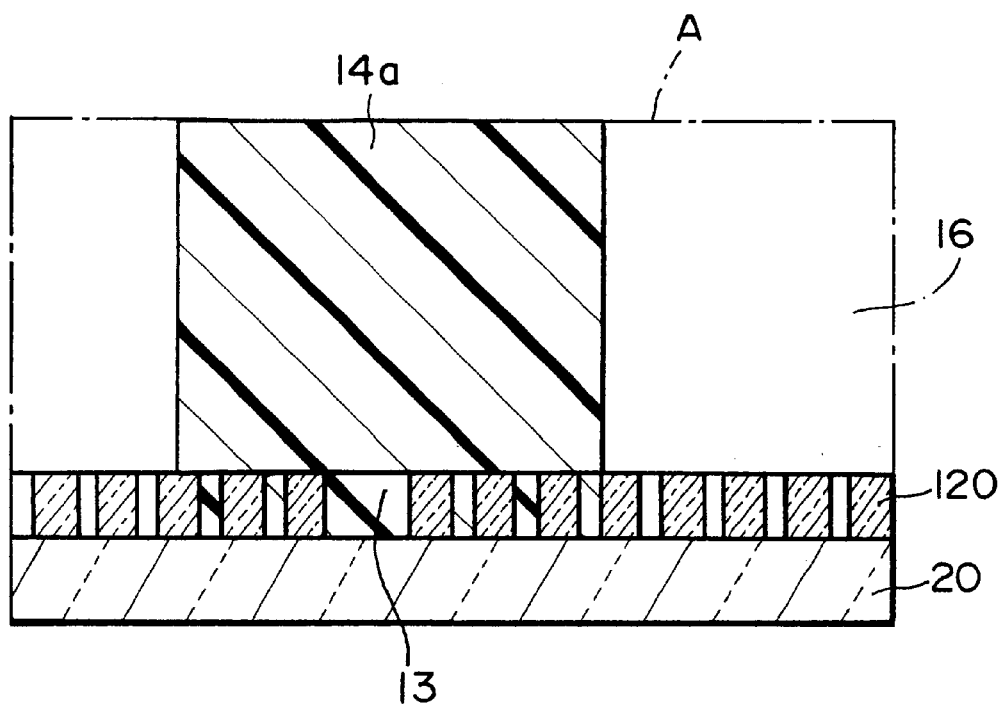
FIG. 17 is an enlarged cross-sectional view showing a section indicated by the symbol A in FIG. 16.
Figure 18:
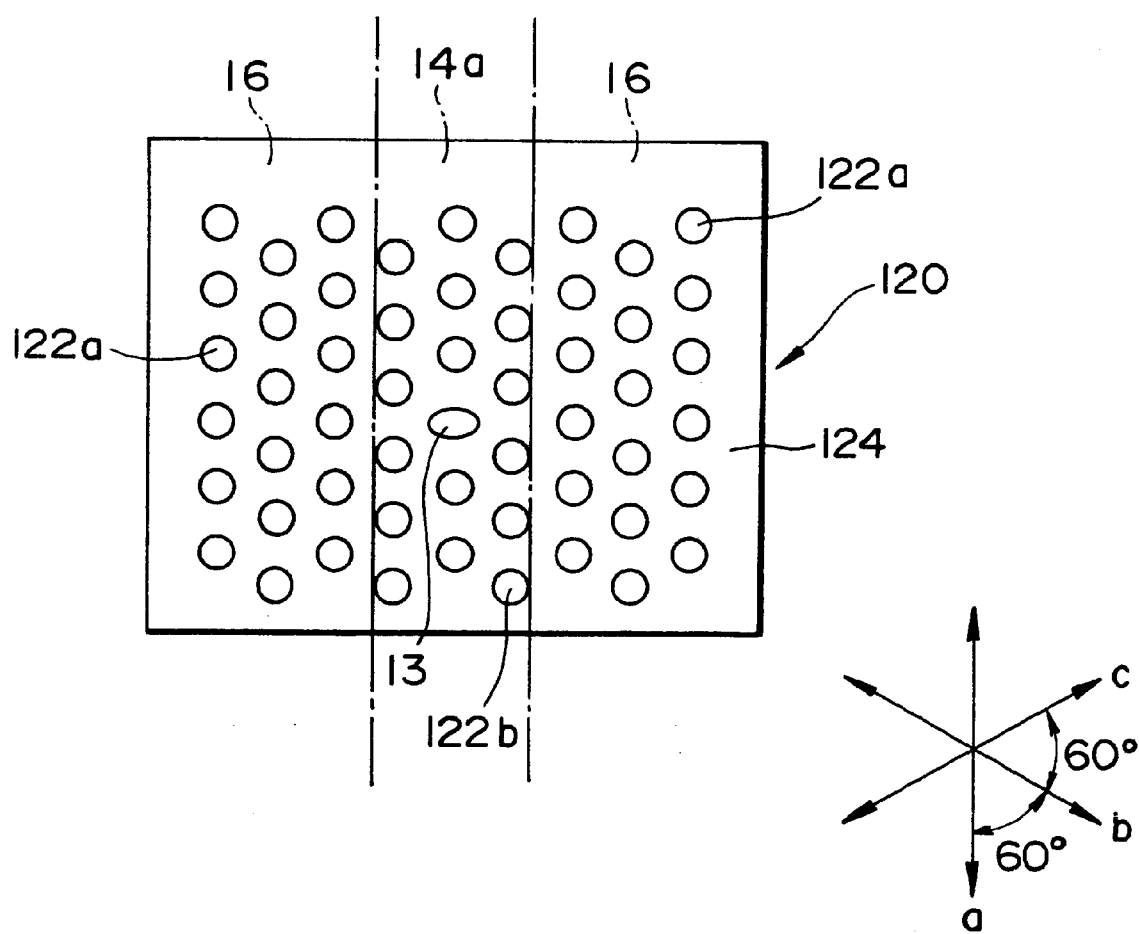
FIG. 18 is a plan view showing an optical section according to the third embodiment of the present invention.

FIG. 16 is a cross-sectional view schematically showing a light-emitting device 3000 according to the present embodiment. FIG. 16 shows a section corresponding to FIG. 4 used to illustrate the first embodiment. FIG. 17 is an enlarged cross-sectional view showing a section indicated by the symbol A in FIG. 16. FIG. 18 is a plan view schematically showing the optical section.

The light-emitting device 3000 differs from the light-emitting device 1000 according to the first embodiment as to the optical section. Sections having substantially the same functions as those of the light-emitting device 1000 are indicated by the same symbols. In the following description, only major features of the light-emitting device 3000 differing from the light-emitting device 1000 are described.

The light-emitting device 3000 includes the substrate 10, the light-emitting device section 100, and a waveguide section (not shown) which are formed on the substrate 10. In the present embodiment, the light-emitting device 3000 does not include the first and second dielectric multilayer films which function as photonic band gaps. The following description mainly focuses on the light-emitting device section 100 differing from that of the first embodiment.

In the light-emitting device section 100, an optical section 120 and the anode 20 which make up a light-propagation section, the light-emitting layer 14, the cathode 22, and the protective layer 60 are disposed on the first substrate 10 in that order. The insulation layer 16 which also functions as a cladding layer and a current concentrating layer is formed to surround the optical section 120 excluding part of the optical section 120.

In the present embodiment, the optical section 120 is formed in the shape of a triangular lattice. The optical section 120 includes first medium layers 122a and 122b and a second medium layer 124 having different refractive indices arranged in a specific pattern, as shown in FIG. 18. Specifically, the first medium layers 122a and 122b are arranged in the shape of a triangular lattice. The materials for the first medium layers 122a and 122b and the second medium layer 124 are not limited insofar as each of these layers can form photonic band gaps by the periodic distribution. In the present embodiment, the first medium layer 122a is formed using the material for forming the insulation layer 16, the first medium layer 122b is formed using the material for forming the light-emitting layer 14 (light-emitting section 14a), and the second medium layer 124 is formed using the material for forming the anode 20.

The first optical section 12 has the defect section 13. The defect section 13 is formed by irregularly forming part of the first medium layer 122b. Specifically, the defect section 13 is formed of a medium layer having a shape differing from other first medium layer 122b disposed at the lattice point. This medium layer is formed of the material for forming the light-emitting layer 14. The defect section 13 is formed so that the energy level caused by the defects is within the emission spectrum from the light-emitting layer 14 by electrical pumping.

In the optical section 120, propagation of light is inhibited in two dimensions in at least three directions (a, b, and c directions), whereby light confinement becomes more perfect in comparison with one direction of the optical section 12 used in the first and second embodiments. This further increases light emission efficiency.

Other structures and effects of the light-emitting device 3000 according to the present embodiment are the same as those of the light-emitting device 1000 according to the first embodiment. Therefore, further description is omitted.

In the present embodiment, a reflection film with a large reflectance such as a dielectric multilayer film mirror or cladding layer may be formed outside the cathode 22 in order to confine light in the direction of the thickness of the substrate 10. For example, if the cathode 22 is thin, the cathode 22 can transmit light emitted in the light-emitting layer 14. In this case, it is preferable to form a reflection films outside the cathode 22. In addition, a reflection film may be formed between the substrate 10 and the anode 20. Light can be confined more securely by forming such a reflection film, thereby increasing light emission efficiency. This structure is also applicable to other embodiments.

Fourth Embodiment

Figure 19:
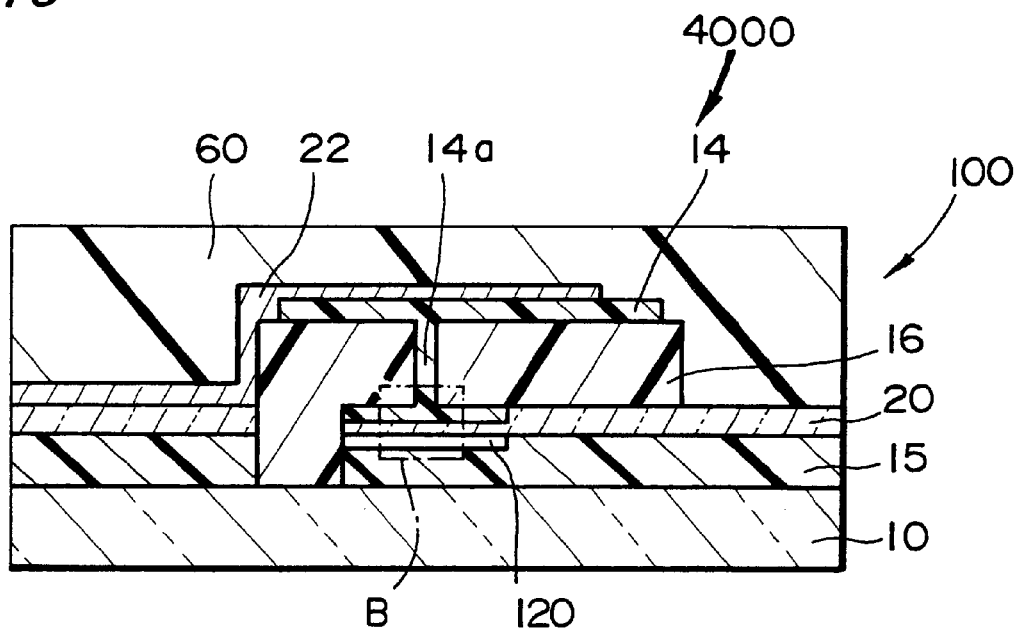
FIG. 19 is a cross-sectional view schematically showing a light-emitting device according to a fourth embodiment of the present invention.
Figure 20:
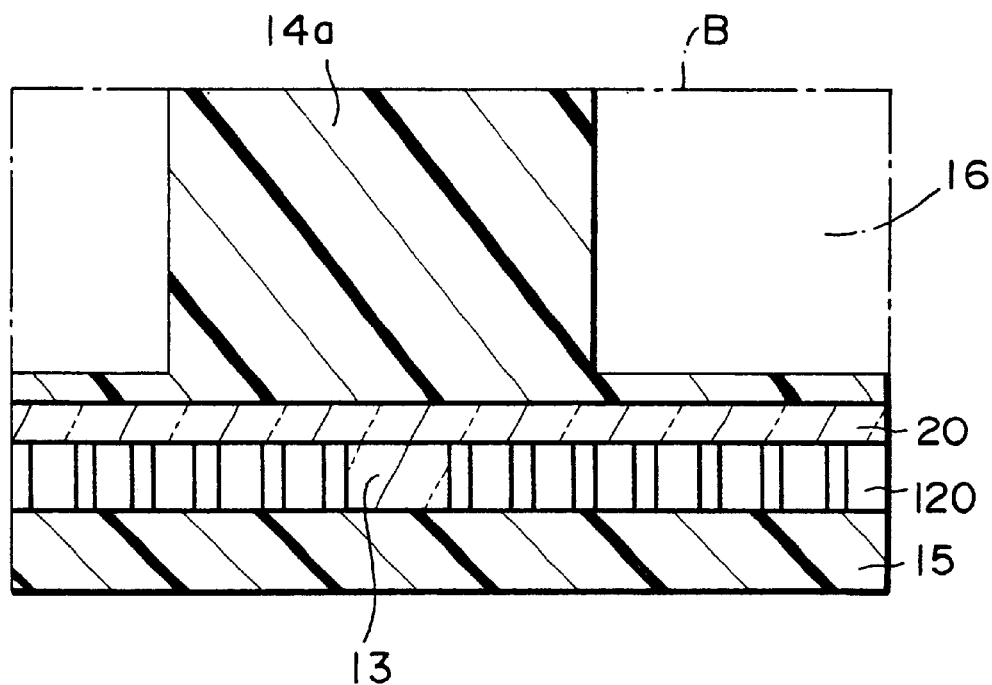
FIG. 20 is an enlarged cross-sectional view showing a section indicated by the symbol B in FIG. 19.
Figure 21:
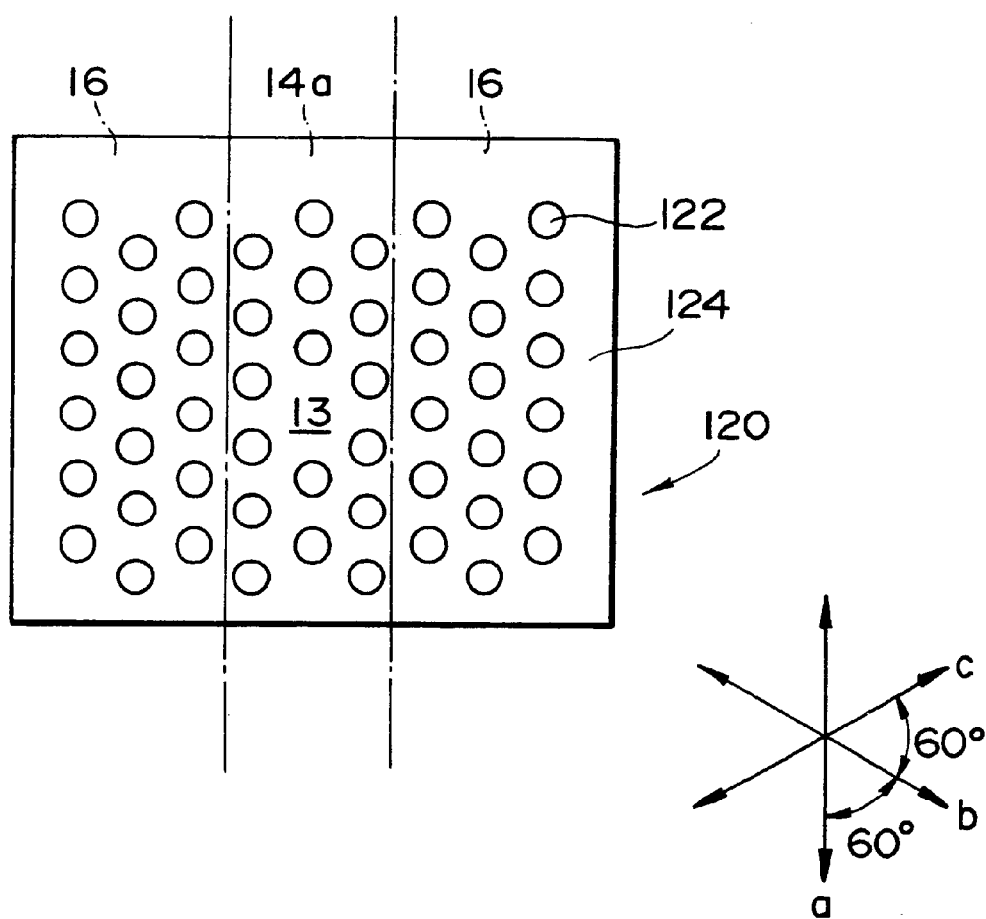
FIG. 21 is a plan view showing an optical section according to the fourth embodiment of the present invention.

FIG. 19 is a cross-sectional view schematically showing a light-emitting device 4000 according to the present embodiment. FIG. 19 shows a section corresponding to FIG. 4 used to illustrate the first embodiment. FIG. 20 is an enlarged cross-sectional view showing a section indicated by the symbol B in FIG. 19. FIG. 21 is a plan view schematically showing the optical section.

The light-emitting device 4000 differs from the light-emitting devices 1000 and 2000 according to the first and second embodiments as to the optical section. Sections having substantially the same functions as those of the light-emitting devices 1000 and 2000 are indicated by the same symbols. In the following description, only major features of the light-emitting device 4000 differing from the light-emitting devices 1000 and 2000 are described.

The light-emitting device 4000 includes the substrate 10, the light-emitting device section 100, and a waveguide section (not shown) which are formed on the substrate 10. The following description mainly focuses on the light-emitting device section 100 differing from those of the first and second embodiments. The light-emitting device 4000 according to the present embodiment is common to the light-emitting device 2000 according to the second embodiment as to the structure of the substrate.

In the light-emitting device section 100, the second substrate (intermediate substrate) 15, the optical section 120 and the anode 20 which make up a light-propagation section, the light-emitting layer 14, the cathode 22, and the protective layer 60 are disposed on the first substrate 10 in that order. The insulation layer 16 which also functions as a cladding layer and a current concentrating layer is formed to surround the optical section 120 excluding part of the optical section 120. The present embodiment differs from the third embodiment in that the second substrate (intermediate substrate) 15 for forming the optical section 12 is disposed on the substrate 10 and the structure of the optical section.

In the present embodiment, the optical section 120 is formed in the shape of a triangular lattice. In the optical section 120, the first medium layer 122 and the second medium layer 124 having different refractive indices are arranged in a predetermined pattern. Specifically, the first medium layer 122 is arranged in the shape of a triangular lattice, as shown in FIG. 21. The materials for the first medium layer 122 and the second medium layer 124 are not limited insofar as each of these layers can form photonic band gaps by the periodic distribution. In the present embodiment, the first medium layer 122 is formed using the material for forming the second substrate 15, and the second medium layer 124 is formed using the material for forming the anode 20. The materials for the first medium layer 122 and the second medium layer 124 may be contrary to the above case.

The optical section 12 has the defect section 13. The defect section 13 is formed by irregularly forming part of the first medium layer 122. Specifically, the defect section 13 is formed by not forming the first medium layer at the lattice point. The defect section 13 is formed so that the energy level caused by the defects is within the emission spectrum from the light-emitting layer 14 by electrical pumping.

In the optical section 120, propagation of light is inhibited in two dimensions in three directions (a, b, and c directions), whereby light confinement becomes more perfect in comparison with one direction of the optical section 120 used in the first and second embodiments. This further increases light emission efficiency.

Other structures and effects of the light-emitting device 4000 according to the present embodiment are the same as those of the light-emitting devices 1000 and 2000 according to the first and second embodiments. Therefore, further description is omitted. The dielectric multilayer films 11a and 11b which form photonic band gaps for confining light in the direction of the thickness of the substrate 10 may be formed in the same manner as in the first embodiment.

Modification Example of Optical Section

Figure 22:
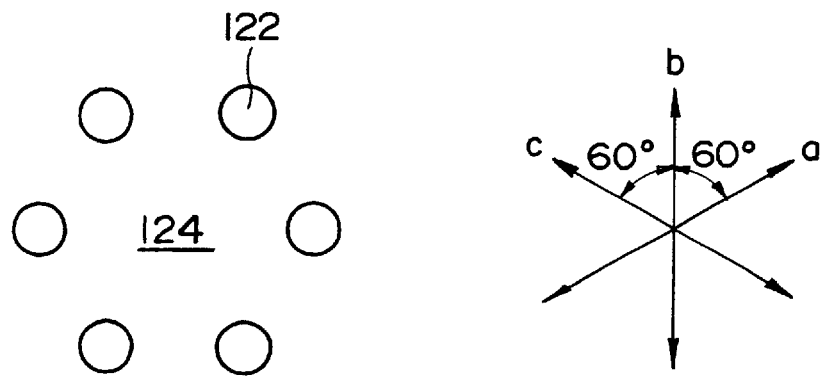
FIG. 22 is a view showing a modification example of the optical section.

In the third and fourth embodiments, structures shown in FIGS. 22 and 23 may be employed for the optical section. In these figures, the same members as those shown in FIGS. 18 and 21 are represented by the same symbols. Detailed description of these members is omitted.

(A) FIG. 22 shows an example in which the optical section is formed in the shape of a honey-comb lattice. In this optical section, since propagation of light is inhibited in two dimensions in three directions (a, b, and c directions), light confinement becomes more perfect in comparison with one direction of the optical section used in the first and second embodiments. This further increases light emission efficiency.

In particular, in the case of the optical section in the shape of a honey-comb lattice shown in FIG. 22, light can be confined as any arbitrary polarized waves.

Figure 23A:
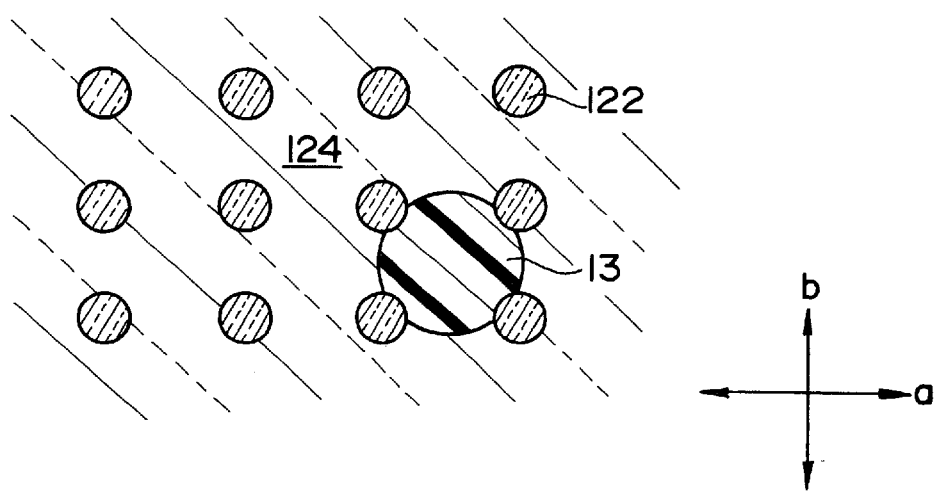
FIGS. 23A and 23B are views showing further modification examples of the optical section.
Figure 23B:
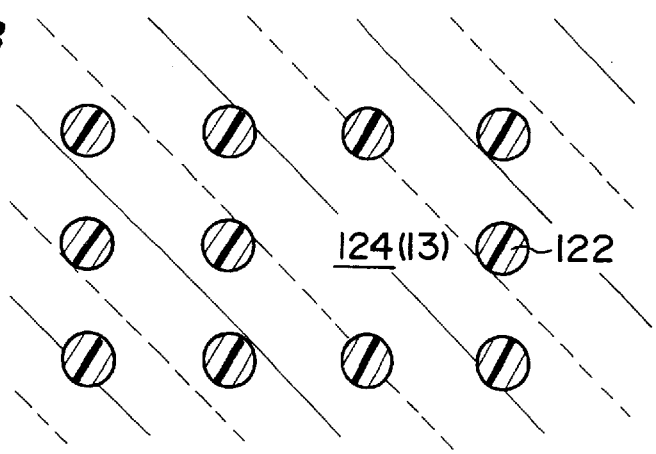

(B) FIGS. 23A an 23B show an example in which the optical section is formed in the shape of a tetragonal lattice. The optical section shown in FIG. 23A has a structure in which the defect section 13 is formed in part of the second medium layer 124. In the optical section shown in FIG. 23B, the defect section is formed by making part of the first medium layer 122 irregular without forming part of the first medium layer, for example.

In these optical sections in the shape of a tetragonal lattice, since propagation of light is inhibited in two dimensions in two directions (a and b directions), light confinement becomes more perfect in comparison with one direction of the optical section used in the first and second embodiments. This further increases light emission efficiency.

In addition, an optical section in which the first and second medium layers are alternately arranged concentrically to surround the medium layer which forms the defect section placed at the center maybe used. In this optical section, since propagation of light can be inhibited in two dimensions in all directions, light confinement can be further increased.

Preferred embodiments of the present invention are described above. However, the present invention is not limited to these embodiments and various modifications are possible within the scope of the present invention. For example, the light-emitting device need not include the first and second dielectric multilayer films 11a and 11b in the first and second embodiments.

What is claimed is:

1. A light-emitting device comprising a substrate and a light-emitting device section, wherein the light-emitting device section comprises:

a light-emitting layer capable of emitting light by electroluminescence;

a pair of electrode layers for applying an electric field to the light-emitting layer;

alight-propagation section for propagating light-emitted in the light-emitting layer;

an insulation layer disposed between the pair of electrode layers, having an opening formed in part, and capable of functioning as a current concentrating layer for specifying a region through which current to be supplied to the light-emitting layer flows through the opening; and an optical section for light propagated through the light-propagation section, wherein the optical section forms photonic band gaps in one dimension or two dimension and has a defect section which is set so that an energy level caused by defects is within a specific emission spectrum, and wherein the light emitted in the light-emitting layer is emitted with spontaneous emission in one dimension or two dimension inhibited by the photonic band gap.

2. The light-emitting device according to claim 1, further comprising a waveguide section integrally formed with the light-emitting device section, wherein the waveguide section comprises:

a core layer which is optically connected with at least part of the light-propagation section; and a cladding layer which is optically connected with the insulation layer.

3. A light-emitting device comprising a light-emitting device section, and a waveguide section which transmits light from the light-emitting device section, the light-emitting device section and the waveguide section being integrally formed on a substrate, wherein the light-emitting device section comprises:

a light-emitting layer capable of emitting light by electroluminescence;

a pair of electrode layers for applying an electric field to the light-emitting layer;

a light-propagation section for propagating light emitted in the light-emitting layer;

an insulation layer which is disposed in contact with the light-propagation section and is capable of functioning as a cladding layer; and an optical section for light propagated through the light-propagation section, wherein the waveguide section comprises:

a core layer integrally formed with at least part of the light-propagation section; and a cladding layer integrally formed with the insulation layer, wherein the optical section forms photonic band gaps in one dimension or two dimension and has a defect section which is set so that an energy level caused by defects is within a specific emission spectrum, and wherein the light emitted in the light-emitting layer is emitted with spontaneous emission in one dimension or two dimension inhibited by the photonic band gap.

4. The light-emitting device according to claim 3, wherein the insulation layer has an opening facing the optical section.

5. The light-emitting device according to claim 1, wherein the opening in the insulation layer has a shape of a slit extending in a periodic direction of the optical section.

6. The light-emitting device according to claim 1, wherein at least part of the light-emitting layer is formed in the opening formed in the insulation layer.

7. The light-emitting device according to claim 2, wherein one of the pair of electrode layers is formed of a transparent conductive material and is capable of functioning as the core layer and at least part of the light-propagation section.

8. The light-emitting device according to claim 2, wherein the core layer is continuous with at least a region in which the optical section is formed.

9. The light-emitting device according to claim 1, wherein the optical section is formed in the light-propagation section.

10. The light-emitting device according to claim 1, wherein the light-emitting device section comprises: a transparent anode formed on the substrate and capable of functioning as at least part of the light-propagation section; the optical section formed in part of the anode; the insulation layer having an opening facing the optical section; the light-emitting layer, at least part of which is formed in the opening in the insulation layer; and a cathode.

11. The light-emitting device according to claim 10, further comprising a waveguide section which is integrally formed with the light-emitting device section and transmits light from the light-emitting device section, wherein the waveguide section comprises:
  a core layer which is formed on the substrate and optically connected with the anode; and
  a cladding layer which covers an exposed area of the core layer and is optically connected with the insulation layer.

12. The light-emitting device according to claim 1, wherein the light-emitting device section comprises: an intermediate substrate disposed on the substrate, the optical section being formed in part of the intermediate substrate: a transparent anode which is formed on the optical section in the intermediate substrate and is capable of functioning as at least part of the light-propagation section; the insulation layer having an opening facing the anode; the light-emitting layer, at least part of which is formed in the opening in the insulation layer; and a cathode.

13. The light-emitting device according to claim 12, further comprising a waveguide section which is integrally formed with the light-emitting device section and transmits light from the light-emitting device section, wherein the waveguide section comprises:
  a core layer which is formed on the intermediate substrate disposed on the substrate and optically connected with the anode; and
  a cladding layer which covers the exposed area of the core layer and is optically connected with the insulation layer.

14. The light-emitting device according to claim 1, wherein the optical section forms a first photonic band gap in one dimension having a periodic refractive index distribution in one direction, and has a second photonic band gap capable of inhibiting spontaneous emission of light in two dimensions in combination with the first photonic band gap of the optical section.

15. The light-emitting device according to claim 1, wherein the optical section forms a two-dimensional photonic band gap having a periodic refractive index distribution in first and second directions, the photonic band gap including a columnar-shaped first medium layer arranged in a shape of a tetragonal lattice, and second medium layer.

16. The light-emitting device according to claim 1, wherein the optical section forms a two-dimensional photonic band gap having a periodic refractive index distribution in first, second, and third directions in one plane, the photonic band gap including a columnar-shaped first medium layer, and a second medium layer.

17. The light-emitting device according to claim 16,
  wherein the first medium layer in the optical section is arranged in a shape of a triangular lattice.

18. The light-emitting device according to claim 16,
  wherein the first medium layer in the optical section is arranged in a shape of a honey-comb lattice.

19. The light-emitting device according to claim 15,
  wherein the first medium layer which form the optical section is formed perpendicularly to the substrate.

20. The light-emitting device according to claim 1, wherein propagation of light propagated through the light-propagation section is inhibited, in a direction in which propagation of light is not inhibited, by the photonic band gap by forming a layer.

21. The light-emitting device according to claim 20,
  wherein the layers which inhibits propagation of light are cladding layers or dielectric multilayer films.

22. The light-emitting device according to claim 1, wherein at least the light-emitting device section is covered with a protective layer.

23. The light-emitting device according to claim 1, wherein the light-emitting layer comprises an organic light-emitting material as the light-emitting.

* * * * *